United States Patent
Li et al.

(10) Patent No.: US 12,237,316 B2
(45) Date of Patent: Feb. 25, 2025

(54) DISPLAY SUBSTRATE, TILED DISPLAY PANEL AND DISPLAY DEVICE

(71) Applicant: BOE Technology Group Co., Ltd., Beijing (CN)

(72) Inventors: Wei Li, Beijing (CN); Can Wang, Beijing (CN); Can Zhang, Beijing (CN); Li Xiao, Beijing (CN); Minghua Xuan, Beijing (CN); Lijun Yuan, Beijing (CN); Jinfei Niu, Beijing (CN); Jingjing Zhang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 453 days.

(21) Appl. No.: 17/778,540

(22) PCT Filed: Jun. 25, 2021

(86) PCT No.: PCT/CN2021/102386
§ 371 (c)(1),
(2) Date: May 20, 2022

(87) PCT Pub. No.: WO2022/267008
PCT Pub. Date: Dec. 29, 2022

(65) Prior Publication Data
US 2023/0069670 A1    Mar. 2, 2023

(51) Int. Cl.
*H01L 23/00*   (2006.01)
*H01L 25/16*   (2023.01)

(52) U.S. Cl.
CPC ............ *H01L 25/167* (2013.01); *H01L 24/05* (2013.01); *H01L 24/06* (2013.01); *H01L 24/32* (2013.01);
(Continued)

(58) Field of Classification Search
CPC ....... H01L 25/167; H01L 24/05; H01L 24/06; H01L 24/32; H01L 24/33; H01L 24/45;
(Continued)

(56) References Cited

U.S. PATENT DOCUMENTS 8,115,216 B2    2/2012 Smith et al.
10,262,977 B2   4/2019 Henry et al.
(Continued)

FOREIGN PATENT DOCUMENTS

CN    101449382 A    6/2009
CN    105047092 A    11/2015
(Continued)

OTHER PUBLICATIONS

Extended European Search Report, for European Patent Application No. 21946502.8, dated Nov. 16, 2023, 8 pages.

*Primary Examiner* — Elias Ullah
(74) *Attorney, Agent, or Firm* — Westman, Champlin & Koehler, P.A.

(57) ABSTRACT

A display substrate, including: a base substrate including at least a side edge and a display area; a plurality of pixel units disposed in the display area, a second pixel unit is located on a side of a first pixel unit close to the side edge, edges of the second pixel unit include the side edge, a third pixel unit is located between the first pixel unit and the second pixel unit, and the third pixel unit is adjacent to the second pixel unit; and a plurality of light emitting diode chips disposed on the base substrate a first light emitting diode chip is located in the first pixel unit, a part of a second light emitting diode chip is located in the second pixel unit, and the other part of the second light emitting diode chip is located in the third pixel unit.

20 Claims, 13 Drawing Sheets

(52) U.S. Cl.
CPC .............. *H01L 24/33* (2013.01); *H01L 24/45* (2013.01); *H01L 24/48* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/0568* (2013.01); *H01L 2224/0603* (2013.01); *H01L 2224/08145* (2013.01); *H01L 2224/32225* (2013.01); *H01L 2224/33183* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/48095* (2013.01); *H01L 2224/48157* (2013.01); *H01L 2224/48227* (2013.01); *H01L 2224/73215* (2013.01); *H01L 2224/83005* (2013.01); *H01L 2224/85005* (2013.01); *H01L 2224/8593* (2013.01); *H01L 2924/0132* (2013.01); *H01L 2924/12041* (2013.01)

(58) Field of Classification Search
CPC ........... H01L 24/48; H01L 2224/05573; H01L 2224/05624; H01L 2224/05639; H01L 2224/05644; H01L 2224/05647; H01L 2224/0568; H01L 2224/0603; H01L 2224/08145; H01L 2224/32225; H01L 2224/33183; H01L 2224/45015; H01L 2224/45124; H01L 2224/45139; H01L 2224/45144; H01L 2224/45147; H01L 2224/48095; H01L 2224/48157; H01L 2224/48227; H01L 2224/73215; H01L 2224/83005; H01L 2224/85005; H01L 2224/8593; H01L 2924/0132; H01L 2924/12041; H01L 24/43; H01L 24/85; H01L 25/0753; H01L 33/504; H01L 27/156; H01L 33/62

See application file for complete search history.

(56) References Cited

U.S. PATENT DOCUMENTS

| | | |
|---|---|---|
| 10,707,191 B2 | 7/2020 | Henry et al. |
| 11,158,613 B2 | 10/2021 | Henry et al. |
| 11,282,820 B2 | 3/2022 | Takeya et al. |
| 11,374,053 B2 | 6/2022 | Garner et al. |
| 2009/0302331 A1 | 12/2009 | Smith et al. |
| 2013/0228805 A1 | 9/2013 | Yagi |
| 2017/0039923 A1 | 2/2017 | Feng |
| 2017/0278904 A1 | 9/2017 | Park et al. |
| 2018/0097043 A1 | 4/2018 | Song |
| 2018/0211940 A1 | 7/2018 | Henry et al. |
| 2019/0237442 A1 | 8/2019 | Henry et al. |
| 2019/0244938 A1 | 8/2019 | Bang et al. |
| 2019/0371213 A1 | 12/2019 | Liu |
| 2020/0235173 A1 | 7/2020 | Nakamura |
| 2020/0343228 A1 | 10/2020 | Henry et al. |
| 2020/0357845 A1 | 11/2020 | Garner et al. |
| 2021/0111162 A1 | 4/2021 | Takeya et al. |
| 2022/0037293 A1 | 2/2022 | Henry et al. |
| 2022/0238496 A1 | 7/2022 | Takeya et al. |
| 2022/0285327 A1 | 9/2022 | Takeya et al. |
| 2022/0285431 A1 | 9/2022 | Garner et al. |

FOREIGN PATENT DOCUMENTS

| | | |
|---|---|---|
| CN | 111480232 A | 7/2020 |
| CN | 111864123 A | 10/2020 |
| EP | 3680932 A1 | 7/2020 |
| KR | 20170101056 A | 9/2017 |
| KR | 20170135651 A | 12/2017 |
| WO | 2016016461 A1 | 2/2016 |

DISPLAY SUBSTRATE, TILED DISPLAY PANEL AND DISPLAY DEVICE

CROSS-REFERENCE TO RELATED APPLICATION

This application is a Section 371 National Stage Application of International Application No. PCT/CN2021/102386, filed on Jun. 25, 2021, filed in Chinese, entitled "DISPLAY SUBSTRATE, TILED DISPLAY PANEL AND DISPLAY DEVICE", the content of which is hereby incorporated by reference in its entirety.

TECHNICAL FIELD

The present disclosure relates to a field of display technology, and in particular, to a display substrate, a tiled display panel and a display device.

BACKGROUND

Light Emitting Diode (LED) technology has been developed for nearly 30 years, and its application range has been continuously expanded. For example, it may be applied to the field of display as the backlight source of the display device or the display screen of the LED. With the development of the technology, Mini Light Emitting Diode (Mini LED) display technology and Micro Light Emitting Diode (Micro LED) display technology have gradually become a hot spot of display devices. The LED has advantages of self-illumination, wide viewing angle, fast response, simple structure, long life, etc. Moreover, Mini LED/Micro LED display may realize large-scale display by tiling, so that they may have good market prospects. At present, the structure and the manufacturing process of the Mini LED/Micro LED display device are one of the important topics concerned by researchers.

The above information disclosed in this section is only for an understanding of the background of the inventive concept of the present disclosure. Therefore, it may contain information that does not constitute the prior art.

SUMMARY

In an aspect, a display substrate is provided, including: a base substrate including at least a side edge and a display area; a plurality of pixel units disposed in the display area including a first pixel unit, a second pixel unit and a third pixel unit, wherein the second pixel unit is located on a side of the first pixel unit close to the side edge, edges of the second pixel unit include the side edge, the third pixel unit is located between the first pixel unit and the second pixel unit, and the third pixel unit is adjacent to the second pixel unit; and a plurality of light emitting diode chips disposed on the base substrate including a first light emitting diode chip and a second light emitting diode chip, wherein the first light emitting diode chip is located in the first pixel unit, a part of the second light emitting diode chip is located in the second pixel unit, and the other part of the second light emitting diode chip is located in the third pixel unit.

According to some exemplary embodiments, a shortest distance, between the second light emitting diode chip and a boundary of the second pixel unit where the part of the second light emitting diode chip is located close to the side edge, is greater than a shortest distance, between the first light emitting diode chip and a boundary of the first pixel unit where the part of the first light emitting diode chip is located.

According to some exemplary embodiments, an area of an orthographic projection of the part of the second light emitting diode chip located in the second pixel unit on the base substrate is smaller than an area of an orthographic projection of the first light emitting diode chip on the base substrate.

According to some exemplary embodiments, an area of an orthographic projection of the second light emitting diode chip on the base substrate is greater than the area of the first light emitting diode chip on the base substrate, and the area of the orthographic projection of the second light emitting diode chip on the base substrate is smaller than two times the area of the first light emitting diode chip on the base substrate.

According to some exemplary embodiments, the plurality of pixel units further includes a fourth pixel unit, a fifth pixel unit, a sixth pixel unit and a seventh pixel unit, edges of the fourth pixel unit include a first side edge and a second side edge intersecting with each other, and the fifth pixel unit, the sixth pixel unit and the seventh pixel unit are adjacent to the fourth pixel unit, respectively; wherein the plurality of light emitting diode chips further includes a third light emitting diode chip, a part of the third light emitting diode chip is located in the fourth pixel unit, and other parts of the third light emitting diode chip are located in the fifth pixel unit, the sixth pixel unit and the seventh pixel unit, respectively.

According to some exemplary embodiments, a shortest distance, between the third light emitting diode chip and a boundary of the third pixel unit where the part of the third light emitting diode chip is located close to the side edge, is greater than a shortest distance, between the first light emitting diode chip and a boundary of the first pixel unit where the part of the first light emitting diode chip is located.

According to some exemplary embodiments, an area of an orthographic projection of the part of the third light emitting diode chip located in the fourth pixel unit on the base substrate is smaller than an area of an orthographic projection of the first light emitting diode chip on the base substrate.

According to some exemplary embodiments, an area of an orthographic projection of the third light emitting diode chip on the base substrate is greater than the area of the first light emitting diode chip on the base substrate, and the area of the orthographic projection of the third light emitting diode chip on the base substrate is smaller than four times the area of the first light emitting diode chip on the base substrate.

According to some exemplary embodiments, the light emitting diode chip includes a substrate, and a plurality of light emitting regions, a plurality of anodes and a cathode disposed on the substrate, the plurality of light emitting regions are in one-to-one correspondence with the plurality of anodes, and the plurality of light emitting regions are arranged at intervals from each other.

According to some exemplary embodiments, the light emitting diode chip further includes a cathode pad electrically connected to the cathode, and the cathode pad and the plurality of light emitting regions are arranged at intervals from each other.

According to some exemplary embodiments, some of a plurality of light emitting regions of the second light emitting diode chip are located in the second pixel unit, some others of the plurality of light emitting regions are located in the third pixel unit, and the number of the light emitting regions of the second light emitting diode chip is greater than the number of the light emitting regions of the first light emitting diode chip.

According to some exemplary embodiments, some of a plurality of light emitting regions of a third light emitting diode chip are located in a fourth pixel unit, some others of the plurality of light emitting regions are located in a fifth pixel unit, a sixth pixel unit and a seventh pixel unit, respectively, and the number of the light emitting regions of the third light emitting diode chip is greater than the number of the light emitting regions of the second light emitting diode chip.

According to some exemplary embodiments, an orthographic projection of a cathode pad of the second light emitting diode chip is located at a junction of the second pixel unit and the third pixel unit.

According to some exemplary embodiments, an orthographic projection of a cathode pad of a third light emitting diode chip is located at a junction of a fourth pixel unit, a fifth pixel unit, a sixth pixel unit and a seventh pixel unit.

According to some exemplary embodiments, the plurality of light emitting regions of the light emitting diode chip are spaced apart from each other by more than 8 microns.

According to some exemplary embodiments, the display substrate further includes a wiring region located at the at least one side edge; wherein the display substrate further includes a plurality of wirings in the wiring region, and the plurality of wirings are configured to provided electrical signals to the plurality of light emitting diode chips, respectively.

According to some exemplary embodiments, the display substrate further includes a plurality of light conversion portions, and orthographic projections of the plurality of light conversion portions on the base substrate at least partially overlap with orthographic projections of the plurality of light emitting regions on the base substrate, respectively.

In another aspect, a tiled display panel is provided, including: a plurality of first display substrates and a plurality of second display substrates, wherein the plurality of first display substrates and the plurality of second display substrates are the display substrate described above, wherein a side edge of the first display substrate is tiled with a side edge of the second display substrate in a first direction, and/or the side edge of the first display substrate is tiled with the side edge of the second display substrate in a second direction, and the first direction intersects with the second direction.

According to some exemplary embodiments, the first display substrate and the second display substrate are distributed axially symmetrically along a tiling position, and the tiling position includes the side edge of the first display substrate close to the second display substrate and the side edge of the second display substrate close to the first display substrate.

In yet another aspect, a display device is provided, including the tiled display panel described above; and a driving circuit configured to drive the tiled display panel.

BRIEF DESCRIPTION OF THE DRAWINGS

Other objects and advantages of the present disclosure will become apparent from the following descriptions of the present disclosure with reference to the accompanying drawings, and may facilitate a comprehensive understanding of the present disclosure.

Figure 1:
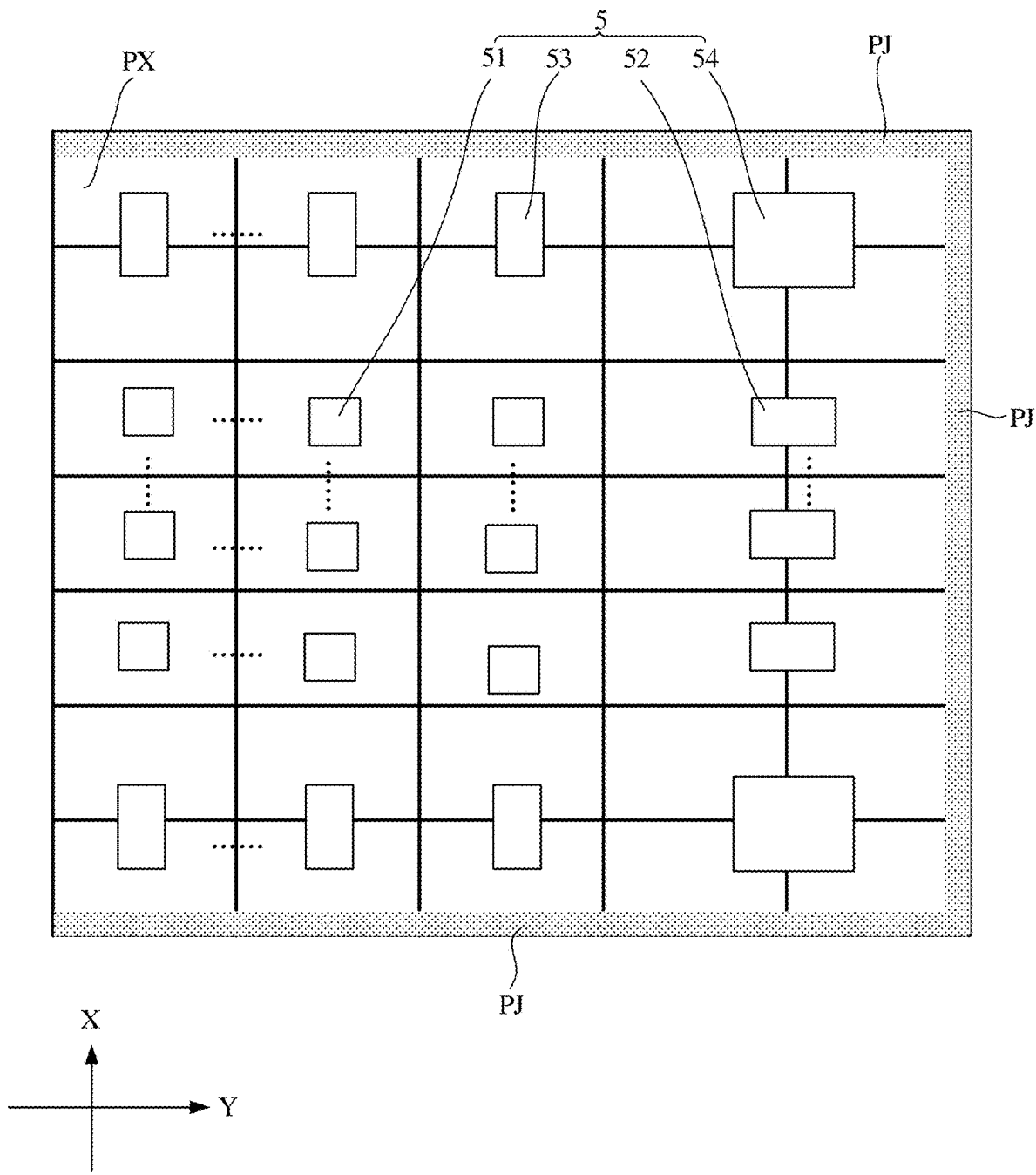
FIG. 1 is a schematic plan view of a display substrate according to some exemplary embodiments of the present disclosure.

It should be noted that, in the drawings for describing THE embodiments of the present disclosure, dimensions of layers, structures or regions may be exaggerated or reduced for clarity, ie, the drawings are not drawn to actual scale.

DETAILED DESCRIPTION OF EMBODIMENTS

In the following descriptions, for purpose of explanation, various specific details are set forth to provide a comprehensive understanding of various exemplary embodiments. However, it is apparent that various exemplary embodiments may be implemented without these specific details or with one or more equivalent arrangements. In other instances, well-known structures and devices are shown in forms of block diagrams to avoid unnecessarily obscuring the various exemplary embodiments. Furthermore, the various exemplary embodiments may vary, but are not necessarily exclusive. For example, specific shapes, configurations, and characteristics of an exemplary embodiment may be used or implemented in another exemplary embodiment without departing from the inventive concept.

In the drawings, sizes and relative sizes of elements may be enlarged for clarity and/or descriptive purposes. In this way, the sizes and relative sizes of the various elements are not necessarily limited to those shown in the drawings. When the exemplary embodiments may be implemented differently in a specific process sequence differently from a described sequence. For example, two consecutively described processes may be performed substantially simultaneously or in a reverse sequence of the described sequence. Furthermore, the same reference numerals refer to the same elements.

When an element is described as being "on," "connected to," or "coupled to" another element, the element may be directly on, directly connected to, or directly coupled to the another element, or an intervening element may be present. However, when an element is described as being "directly on," "directly connected to," or "directly coupled to" another element, no intervening element is present. Other terms and/or expressions used to describe a relationship between elements should be interpreted in a similar manner. For example, "between" and "directly between", "adjacent" and "directly adjacent", "or "on" and "directly on", etc. Furthermore, the term "connected" may refer to a physical connection, an electrical connection, a communication connection, and/or a fluid connection. In addition, an X axis, a Y axis and a Z axis are not limited to three axes of a rectangular coordinate system, and may be interpreted in a broader sense. For example, the X axis, the Y axis, and the Z axis may be perpendicular to each other, or may represent different directions that are not perpendicular to each other. For the purpose of this disclosure, "at least one of X, Y, and Z" and "at least one selected from a group consisting of X, Y, and Z" may be interpreted as X only, Y only, Z only, or any combination of two or more of X, Y and Z such as XYZ, XY, YZ and XZ. As used herein, the term "and/or" includes any and all combinations of one or more of associated listed items.

It will be understood that, although terms "first", "second", etc. may be used herein to describe different elements, these elements should not be limited by these terms. These terms are only used to distinguish one element from another. For example, without departing from the scope of exemplary embodiments, a first element may be referred to as a second element, similarly, a second element may be referred to as a first element.

Herein, an inorganic light emitting diode refers to a light emitting element made of an inorganic material, wherein an LED represents an inorganic light emitting element different from an OLED. Specifically, the inorganic light emitting element may include a Mini Light Emitting Diode (Mini LED) and a Micro Light Emitting Diode (Micro LED). A micro light emitting diode (ie Micro LED) refers to an ultra-small light emitting diode with a grain size below 100 microns, and a mini light emitting diode (ie Mini LED) refers to small-scale light emitting diode with a grain size between a Micro LED and a traditional LED. For example, a grain size of the Mini LED may be between 100 and 300 microns, and the grain size of the Micro LED may be between 10 and 100 microns.

Some exemplary embodiments of the present disclosure provide a display substrate, a display panel including the display substrate, and a display device. For example, the display substrate includes: a base substrate including at least one side edge and a display area; a plurality of pixel units disposed in the display area including a first pixel unit, a second pixel unit and a third pixel unit. The second pixel unit is located on a side of the first pixel unit close to the side edge, edges of the second pixel unit include a side edge, the third pixel unit is located between the first pixel unit and the second pixel unit, the third pixel unit is adjacent to the second pixel unit; and a plurality of light emitting diode chips disposed on the base substrate, the plurality of light emitting diode chips including a first light emitting diode chip and a second light emitting diode chip, wherein the first light emitting diode chip is located in the first pixel unit, a part of the second light emitting diode chip is located in the second pixel unit, and other parts of the second light emitting diode chip are located in the third pixel unit.

For another example, some embodiments of the present disclosure provide a display substrate, including: a base substrate including a first side edge and a first area away from the first side edge; a plurality of pixel units disposed on the base substrate, the plurality of pixel units includes a first pixel unit located in the first area and a second pixel unit close to the first side edge, and the first pixel unit is located on a side of the second pixel unit away from the first side edge; a plurality of light emitting diode chips disposed on the base substrate, the plurality of light emitting diode chips includes a first light emitting diode chip and a second light emitting diode chip, wherein the first light emitting diode chip is located in the first pixel unit, and at least a part of the second light emitting diode chip is located in the second pixel unit. The second pixel unit includes a second pixel unit boundary close to the first side edge, the second light emitting diode chip includes a second chip side portion close to the first side edge, and a vertical distance between an orthographic projection of the second chip side portion on the base substrate and an orthographic projection of the second pixel unit boundary on the base substrate is greater than or equal to a specified distance; and the first pixel unit includes a first pixel unit boundary parallel to the first side edge, the first light emitting diode chip has a first chip side portion close to the first pixel unit boundary, and a vertical distance between an orthographic projection of the first chip side portion on the base substrate and an orthographic projection of the first pixel unit boundary on the base substrate is smaller than the vertical distance between the orthographic projection of the second chip side portion on the base substrate and the orthographic projection of the second pixel unit boundary on the base substrate.

In this way, in the embodiments of the present disclosure, a larger tiling distance may be reserved at the side edge of the display substrate, which is beneficial for the tiling of a plurality of display substrates.

Wire Bonding is a process of tightly bonding a metal bonding wire to a substrate pad by using heat, pressure or ultrasonic energy. For example, wire bonding may be used in IC packaging to connect a semiconductor die pad to an I/O bonding wire of a microelectronic package or a metal wiring pad on a substrate with metal filaments. A principle of the wire bonding is to destroy an oxide layer and contaminants on a surface to be welded by heating, pressuring or by using ultrasonic waves, causing a plastic deformation, so that the metal bonding wire is in close contact with the welded surface, reaching a gravitational range between atoms and causing an atomic diffusion between interfaces to form a welding joint.

FIG. 1 is a schematic plan view of a display substrate according to some exemplary embodiments of the present disclosure. Referring to FIG. 1, the display substrate may include: a base substrate 1; a plurality of pixel units PX disposed on the base substrate 1; and a plurality of light emitting diode chips 5 disposed on the base substrate 1. In the embodiments of the present disclosure, the plurality of light emitting diode chips 5 include a first light emitting diode chip 51 and a second light emitting diode chip 52. For example, the second light emitting diode chip 52 is arranged in a pixel unit close to a side edge of the display substrate, and the first light emitting diode chip 51 is arranged in a pixel unit away from the side edge of the display substrate. In the embodiments of the present disclosure, the display substrate may be used as a display substrate of a tiled display panel. For example, in the embodiment of FIG. 1, tiled areas PJ are schematically shown on an upper side, a right side and a lower side of the display substrate. The second light emitting diode chip 52 may be disposed in a pixel unit PX close to the tiled area PJ.

Continuing to refer to FIG. 1, the plurality of light emitting diode chips 5 include the second light emitting diode chip 52 and a fourth light emitting diode chip 53. For example, the second LED chip 52 may be disposed in the pixel unit close to the tiled area at a right edge, and the fourth LED chip 53 may be disposed in the pixel unit close to the tiled area at an upper edge and a lower edge. Optionally, specifications and dimensions of the second light emitting diode chip 52 and the fourth light emitting diode chip 53 may be substantially the same, but when being disposed on the base substrate 1, the second light emitting diode chip 52 may rotate by a certain angle with respect to the light emitting diode chip 53, for example, by 90°.

It should be noted that, herein, the specifications and dimensions of the second light emitting diode chip 52 and the fourth light emitting diode chip 53 may be substantially the same. Therefore, in other sections, for ease of description, the second light emitting diode chip 52 and the fourth light emitting diode chip 53 may be collectively referred to as the second light emitting diode chip.

Continuing to refer to FIG. 1, the plurality of light emitting diode chips 5 include a third light emitting diode chip 54. For example, the third light emitting diode chip 54 may be disposed in a pixel unit close to the tiled area and close to each corner of the display substrate. In the embodiment shown in FIG. 1, the third light emitting diode chips 54 may be disposed at an upper right corner and a lower right corner of the display substrate, respectively.

Figure 2:
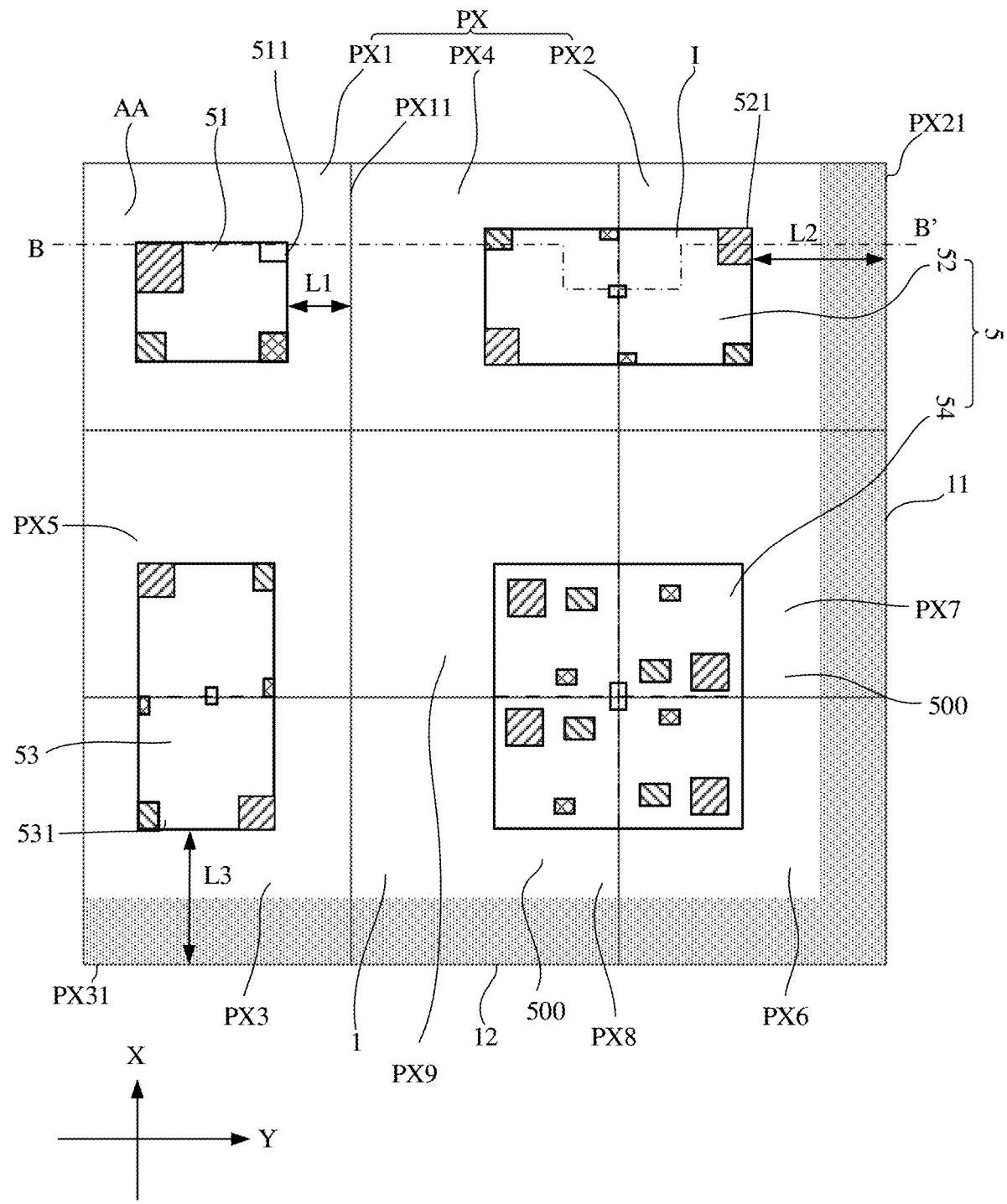
FIG. 2 is a partial plan view of a display substrate according to some exemplary embodiments of the present disclosure.
Figure 3:
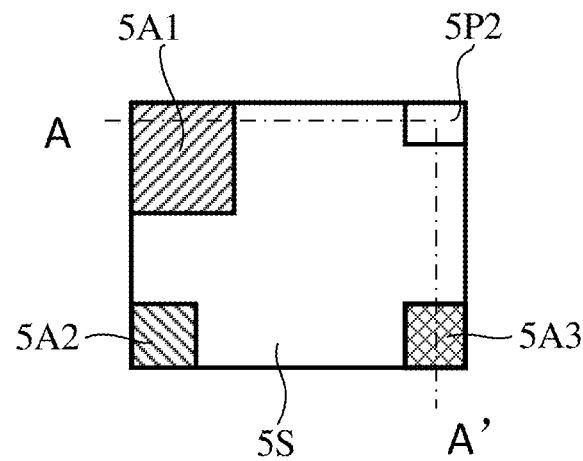
FIG. 3 is a partial enlarged view of a first light emitting diode chip included in a display substrate according to some exemplary embodiments of the present disclosure.
Figure 4:
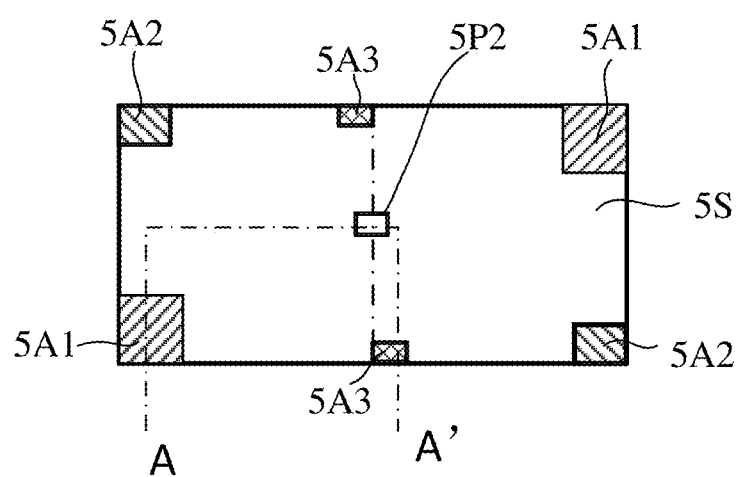
FIG. 4 is a partial enlarged view of a second light emitting diode chip or a fourth light emitting diode chip included in a display substrate according to some exemplary embodiments of the present disclosure.
Figure 5:
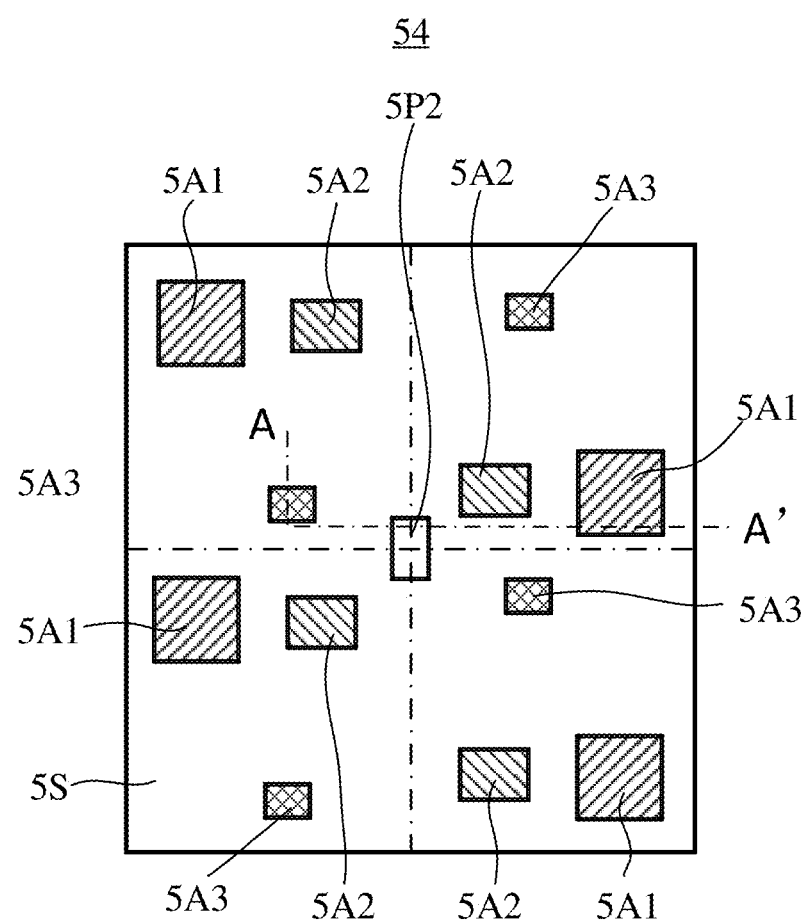
FIG. 5 is a partial enlarged view of a third light emitting diode chip included in a display substrate according to some exemplary embodiments of the present disclosure.
Figure 6:
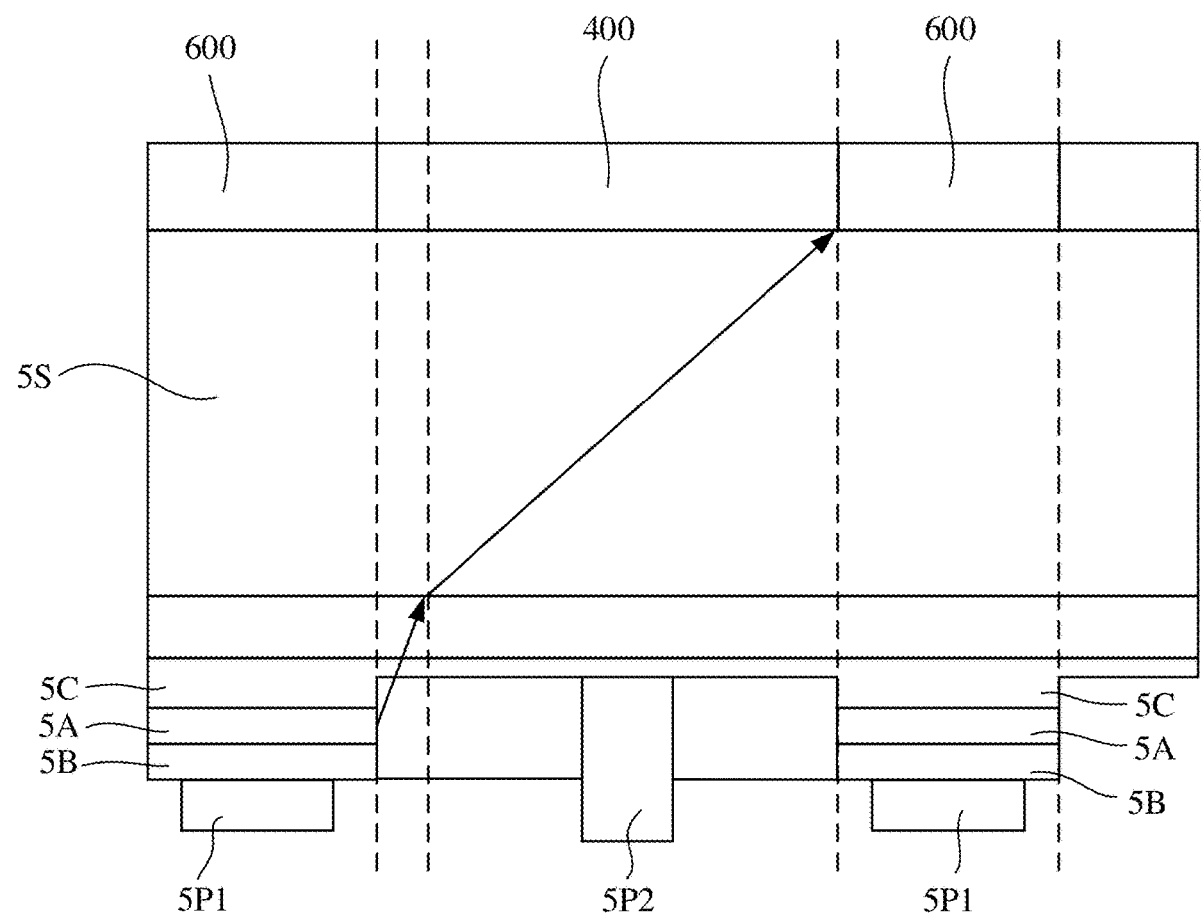
FIG. 6 is a cross-sectional view of a display substrate taken along line AA' in FIG. 3, FIG. 4, or FIG. 5 according to some exemplary embodiments of the present disclosure.

FIG. 2 is a partial plan view of a display substrate according to some exemplary embodiments of the present disclosure. FIG. 3 is a partial enlarged view of a first light emitting diode chip included in a display substrate according to some exemplary embodiments of the present disclosure. FIG. 4 is a partial enlarged view of a second light emitting diode chip or a fourth light emitting diode chip included in a display substrate according to some exemplary embodiments of the present disclosure. FIG. 5 is a partial enlarged view of a third light emitting diode chip included in a display substrate according to some exemplary embodiments of the present disclosure. FIG. 6 is a cross-sectional view of the display substrate taken along line AA' in FIG. 3, FIG. 4 or FIG. 5 according to some exemplary embodiments of the present disclosure.

Referring to FIGS. 1 to 6, the display substrate may include: a base substrate 1, the base substrate 1 including a first side edge 11 and a first area AA away from the first side edge 11; a plurality of pixel units PX disposed on the base substrate 1, the plurality of pixel units including a first pixel unit PX1 located in the first area AA and a second pixel unit PX2 close to the first side edge 11, the first pixel unit PX1 is located on a side of the second pixel unit PX2 away from the first side edge 11; a plurality of light emitting diode chips 5 disposed on the base substrate 1, and the plurality of light emitting diode chips 5 include a first light emitting diode chip 51 and a second light emitting diode chip 52. The first light emitting diode chip 51 is located in the first pixel unit PX1, and at least a part of the second light emitting diode chip 52 is located in the second pixel unit PX2.

It should be noted that, herein, unless otherwise specified, the expression "side edge" means a side surface of a substrate, component or element. As shown in the plan views such as FIG. 1 or FIG. 2, the "side edge" is shown as a line. For example, the first side edge 11 is the rightmost line.

As shown in FIG. 2, the second pixel unit PX2 includes a second pixel unit boundary PX21 close to the first side edge 11, and the second light emitting diode chip 52 includes a second chip side portion PX21 close to the first side edge 11. A vertical distance between an orthographic projection of the second chip side portion 521 on the base substrate 1 and an orthographic projection of the second pixel unit boundary PX21 on the base substrate 1 (For example, L2 in FIG. 2) is greater than or equal to a specified distance. It should be noted that the "specified distance" here may be a tiling distance capable of realizing a tiling of the display panel, and the "specified distance" and the "tiling distance" will be described in more detail below.

For example, the first pixel unit PX1 includes a first pixel unit boundary PX11 parallel to the first side edge 11, and the first light emitting diode chip 51 has a first chip side portion 511 close to the first pixel unit boundary PX11, a vertical distance between an orthographic projection of the first chip side portion 511 on the base substrate 1 and an orthographic projection of the first pixel unit boundary PX11 on the base substrate 1 (for example, L1 in FIG. 2) is smaller than the vertical distance between the orthographic projection of the second chip side portion 521 on the base substrate 1 and the orthographic projection of the second pixel unit boundary PX21 on the base substrate 1 (eg. L2 in FIG. 2). That is, a shortest distance between the second light emitting diode chip 52 and the boundary of the corresponding second pixel unit PX2 close to the side edge is greater than a shortest distance between the first light emitting diode chip 51 and the boundary of the corresponding pixel unit PX1.

In the exemplary embodiment of FIG. 2, a first direction X and a second direction Y are schematically shown. For example, a plurality of pixel units PXs may be arranged in an array in the first direction X and the second direction Y, the first direction X may correspond to a row direction in which the pixel units are arranged, and the second direction Y may correspond to a column direction in which the pixel units are arranged. It should be noted that the embodiments of the present disclosure are not limited thereto.

For example, the base substrate 1 may have a shape of a rectangle, a rounded rectangle, a quadrangle, etc., and the first side edge 11 may be one side edge extending in the second direction Y among the four side edges of the base substrate 1. As shown in FIG. 2, the first side edge 11 may be the right side edge of the base substrate 1. The second pixel unit PX2 may be a certain pixel unit in a column of pixel units closest to the first side edge 11.

In the embodiments of the present disclosure, the light emitting diode chips in a column of pixel units closest to the first side edge 11 are disposed away from the first side edge 11, so that a larger tiling distance may be reserved at the side edge of the display substrate, which is beneficial to the tiling of the plurality of display substrates. The "tiling" will be described in more detail below.

For example, an area of an orthographic projection of the second light emitting diode chip 52 on the base substrate 1 is larger than an area of the orthographic projection of the first light emitting diode chip 51 on the base substrate 1, and the area of the orthographic projection of the second light emitting diode chip 52 on the base substrate 1 is less than twice the area of the orthographic projection of the first light emitting diode chip 51 on the base substrate 1.

For example, the area of the orthographic projection of the part of the second LED chip 52 located in the second pixel unit PX2 on the base substrate 1 is smaller than the area of the orthographic projection of the first LED chip 51 on the base substrate 1. Such arrangement may facilitate the light emitting diode chips in the column of pixel units closest to the first side edge 11 to be disposed away from the first side edge 11, thereby facilitating the tiling of the display substrates.

Continuing to refer to FIG. 2, the base substrate 1 may further include a second side edge 12, and the second side edge 12 is connected with the first side edge 11. Exemplarily, the second side edge 12 may be one side edge extending in the second direction Y among the four side edges of the base substrate 1. For example, the second side edge 12 may be a lower side edge of the base substrate 1.

The plurality of pixel units PX further include an eighth pixel unit PX3 close to the second side edge 12, the plurality of light emitting diode chips 5 further include a fourth light emitting diode chip 53, and at least a part of the fourth light emitting diode chip 53 is located in the eighth pixel unit PX3.

The eighth pixel unit PX3 includes an eighth pixel unit boundary PX31 close to the second side edge 12, the fourth light emitting diode chip 53 includes a third chip side portion 531 close to the second side edge 12. A vertical distance between an orthographic projection of the third chip side portion 531 on the base substrate 1 and an orthographic projection of the eighth pixel unit boundary PX31 on the base substrate 1 (for example, L3 in FIG. 2) is greater than or equal to a specified distance.

For example, an area of an orthographic projection of the fourth light emitting diode chip 53 on the base substrate 1 is larger than the area of the orthographic projection of the first light emitting diode chip 51 on the base substrate 1, and the area of the orthographic projection of the fourth light emitting diode chip 53 on the base substrate 1 is less than twice the area of the orthographic projection of the first light emitting diode chip 51 on the base substrate For example, the area of the orthographic projection of the fourth light emitting diode chip 53 on the base substrate 1 may be substantially equal to the area of the orthographic projection of the second light emitting diode chip 52 on the base substrate 1.

For example, an area of an orthographic projection of a part of the fourth LED chip 53 located in the eighth pixel unit PX3 on the base substrate 1 is smaller than the area of the orthographic projection of the first LED chip 51 on the base substrate 1.

Continuing to refer to FIG. 2, the plurality of pixel units PXs further include a third pixel unit PX4, the third pixel unit PX4 is adjacent to the second pixel unit PX2, and the third pixel unit PX4 is located between the first pixel unit PX1 and the second pixel unit PX2 in a direction perpendicular to the first pixel unit PX4 (for example, the second direction Y), and the third pixel unit PX4 and the second pixel unit PX2 are located in the same row in the direction perpendicular to the first side edge.

In the embodiment of the present disclosure, the second pixel unit PX2 and the third pixel unit PX4 may share the second light emitting diode chip 52. Referring to FIG. 2, a part of the second light emitting diode chip 52 is located in the second pixel unit PX2, and the other part of the second light emitting diode chip 52 is located in the third pixel unit PX4.

For ease of description, the part of the second light emitting diode chip 52 located in the second pixel unit PX2 may be referred to as a first part, and the part of the second light emitting diode chip 52 located in the third pixel unit PX4 may be referred to as a second part. For example, an area of an orthographic projection of the first part of the second light emitting diode chip 52 on the base substrate 1 may be substantially the same as an area of an orthographic projection of the second part of the second light emitting diode chip 52 on the base substrate 1. However, the embodiments of the present disclosure are not limited thereto.

Referring to FIG. 2, the plurality of pixel units PX further include a ninth pixel unit PX5 adjacent to the eighth pixel unit PX3, the ninth pixel unit PX5 is located between the first pixel unit PX1 and the eighth pixel unit PX3 in a direction perpendicular to the second side edge 12 (ie, the first direction X), and the ninth pixel unit PX5 and the eighth pixel unit PX3 are is located in the same column in the direction perpendicular to the second side edge 12.

In the embodiments of the present disclosure, the eighth pixel unit PX3 and the ninth pixel unit PX5 may share the fourth light emitting diode chip 53. Referring to FIG. 2, a part of the fourth light emitting diode chip 53 is located in the eighth pixel unit PX3, and the other part of the fourth light emitting diode chip 53 is located in the ninth pixel unit PX5.

Similarly, for ease of description, the part of the fourth light emitting diode chip 53 located in the eighth pixel unit PX3 may be referred to as a first part, and the part of the fourth light emitting diode chip 53 located in the ninth pixel unit PX5 may be referred to as a second part. For example, an area of an orthographic projection of the first part of the fourth LED chip 53 on the base substrate 1 may be substantially the same as an area of an orthographic projection of the second part of the fourth LED chip 53 on the base substrate 1. However, the embodiments of the present disclosure are not limited thereto.

Continuing to refer to FIG. 2, the plurality of pixel units PX further include a fourth pixel unit PX6, a fifth pixel unit PX7, a sixth pixel unit PX8 and a seventh pixel unit PX9. The fourth pixel unit PX6 is adjacent to a connection position of the first side edge 11 and the second side edge 12. For example, the connection position of the first side edge 11 and the second side edge 12 may correspond to a corner of the base substrate 1. The fifth pixel unit PX7 is adjacent to the fourth pixel unit PX6 in a direction parallel to the first side edge 11, the sixth pixel unit PX8 is adjacent to the fourth pixel unit PX6 in a direction parallel to the second side edge 12, and the seventh pixel unit PX9 is adjacent to the fifth pixel unit PX7 and the sixth pixel unit PX8.

In the embodiments of the present disclosure, the plurality of light emitting diode chips 5 further include a third light emitting diode chip 54, and the fourth pixel unit PX6, the fifth pixel unit PX7, the sixth pixel unit PX8 and the seventh pixel unit PX9 may share the third light emitting diode chip 54. Referring to FIG. 2, the third light emitting diode chip 54 includes four parts (eg, a first part, a second part, a third part and a fourth part), wherein the first part of the third light emitting diode chip 54 is located in the fourth pixel unit PX6, the second part of the third light emitting diode chip 54 is located in the fifth pixel unit PX7, the third part of the third light emitting diode chip 54 is located in the sixth pixel unit PX8, and the fourth part of the third light emitting diode chip 54 is located in the seventh pixel unit PX9. For example, orthographic projection areas of the first part, the second part, the third part and the fourth part of the third light emitting diode chip 54 on the base substrate 1 may be substantially the same. However, the embodiments of the present disclosure are not limited thereto.

In other words, edges of the fourth pixel unit PX6 include a first side edge and a second side edge intersecting with each other. A part of the third light emitting diode chip 54 is located in the fourth pixel unit PX6, and other parts of the third light emitting diode chip 54 are located in the pixel unit adjacent to the fourth pixel unit PX6 (for example, the fifth pixel unit PX7, the sixth pixel unit PX8 and the seventh pixel unit PX9), and the third light emitting diode chip 54 is located in four adjacent pixel units.

For example, a vertical distance between an orthographic projection of a side of the third light emitting diode chip 54 close to the first side edge 11 on the base substrate 1 and the orthographic projection of the first side edge 11 on the base substrate 1 is greater than or equal to a specified distance, and a vertical distance between an orthographic projection of a side of the third light emitting diode chip 54 close to the second side edge 12 on the base substrate 1 and the orthographic projection of the second side edge 12 on the base substrate 1 is greater than or equal to a specified distance. That is, a shortest distance between the third light emitting diode chip 54 and a boundary of the corresponding fourth pixel unit PX6 closest to the side edge is greater than the shortest distance between the first light emitting diode chip 51 and the boundary of the corresponding first pixel unit PX1.

For example, the area of the orthographic projection of the second light emitting diode chip 52 or the fourth light emitting diode chip 53 on the base substrate 1 is smaller than an area of an orthographic projection of the third light emitting diode chip 54 on the base substrate 1.

An area of an orthographic projection of the part of the third light emitting diode chip 54 in the fourth pixel unit PX6 on the base substrate is smaller than the orthographic projection of the first light emitting diode chip 51 on the base substrate area.

The area of the orthographic projection of the third light emitting diode chip 54 on the base substrate is larger than the area of the orthographic projection of the first light emitting diode chip 51 on the base substrate, and the area of the orthographic projection of the third light emitting diode chip 54 on the base substrate is less than 4 times the area of the orthographic projection of the first light emitting diode chip 51 on the base substrate.

In the embodiment of the present disclosure, through the above arrangement, the light emitting diode chips in a column of pixel units and a row of pixel units closest to the side edge of the display substrate may be disposed far away from the side edge in either the first direction or the second direction, and the pixel unit closest to the corner of the display substrate may be further disposed away from the corner in both the first direction and the second direction, which is beneficial to ensure a sufficient tiling distance of the display substrate, and is beneficial to realizing a tiled display panel and a tiled display device.

It should be noted that, herein, a structure of the eighth pixel unit PX3 and a structure of the second pixel unit PX2 may be substantially the same, and the two are only differentiated in arrangements. Therefore, in other sections, for ease of description, the eighth pixel unit PX3 and the second pixel unit PX3 may be collectively referred to as the second pixel unit; similarly, a structure of the ninth pixel unit PX5 and the third pixel unit PX4 may be substantially the same, and the two are only differentiated in arrangements. Therefore, in other sections, for ease of description, the ninth pixel unit PX5 and the third pixel unit PX4 may be collectively referred to as the third pixel unit.

Figure 12:
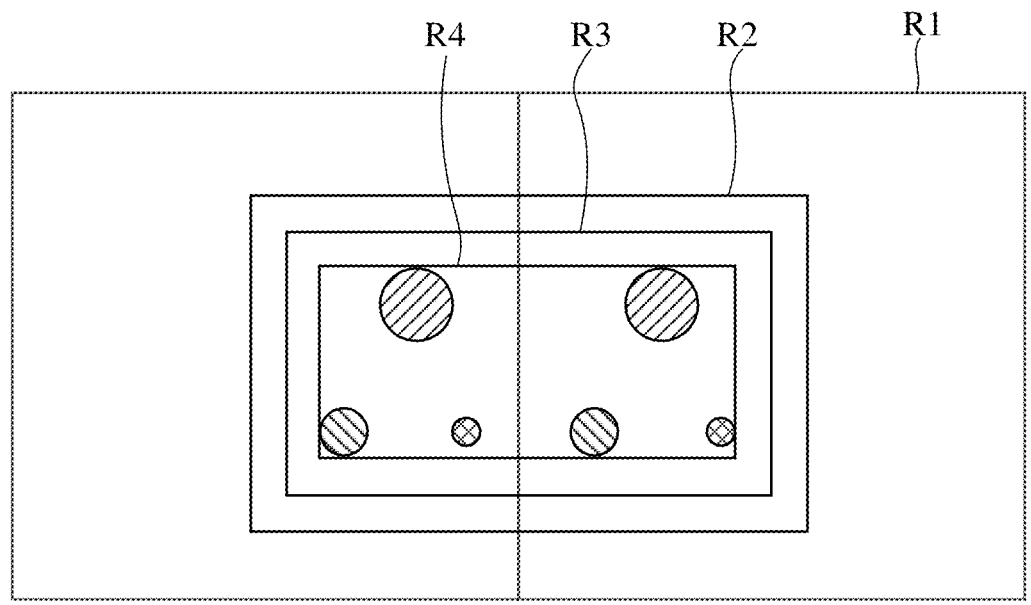
FIG. 12 is a partial enlarged view of a display substrate at part I in FIG. 2 according to some exemplary embodiments of the present disclosure.

FIG. 12 is a partial enlarged view of the display substrate according to some exemplary embodiments of the present disclosure at part I in FIG. 2. Referring to FIG. 2, FIG. 4 and FIG. 12, a plurality of boundaries are schematically shown with a plurality of rectangular boxes. For example, a rectangular box R1 represents a boundary of a pixel unit, a rectangular box R2 represents a boundary of a light emitting diode chip, a rectangular box R3 represents a boundary of a protective layer, and a rectangular box R4 represents a boundary of a plurality of light emitting regions or PADs of the light emitting diode chip. For example, in a process of transferring a plurality of light emitting diode chips to the base substrate, a certain positional deviation may occur limited by an accuracy of the transfer process. Considering the position deviation, there is a certain separation distance between the rectangular box R1 and the rectangular box R2 in the first direction X and the second direction Y, and the separation distance is designed to avoid an interference of two adjacent light emitting diode chips. For another example, there is a certain separation distance between the rectangular box R2 and the rectangular box R3 in the first direction X and the second direction Y, and the separation distance takes into account a process error generated during a laser cutting of the chip. For another example, there is a certain separation distance between the rectangular box R2 and the rectangular box R3 in the first direction X and the second direction Y, and the separation distance takes into account a process error generated during a forming of the protective layer.

In the embodiments of the present disclosure, referring to FIGS. 2 to 6, the light emitting diode chip 5 (which may be the first light emitting diode chip 51, the second light emitting diode chip 52, the fourth light emitting diode chip 53 or the third light emitting diode chip 54) may include a substrate 5S, a light emitting region 5A, a cathode 5C, and an anode 5B. For example, the substrate 5S may be a sapphire substrate. The light emitting diode chip 5 may have a flip-chip structure. The light emitting region 5A is sandwiched between the cathode 5C and the anode 5B. A light emitting diode chip 5 may include a plurality of light emitting regions 5A, and each light emitting region 5A corresponds to an anode 5B, respectively. Each anode 5B is electrically connected to a corresponding anode pad 5P1. A light emitting diode chip 5 may have a common cathode 5C electrically connected to a cathode pad 5P2. Through the anode pad 5P1 and the cathode pad 5P2, the anode 5B and the cathode 5C may be supplied with specified electrical signals, respectively. For example, in a light emitting diode chip 5, the plurality of light emitting regions 5A and the plurality of anodes 5B are in one-to-one correspondence, the plurality of light emitting regions 5A are arranged at intervals from each other, and the cathode pad 5P2 and the plurality of light emitting regions 5A are arranged at intervals from each other.

Referring to FIGS. 3 and 6, the first light emitting diode chip 51 may include three light emitting regions 5A. Correspondingly, the first light emitting diode chip 51 may include three anodes 5B and one common cathode 5C. The three light emitting regions 5A are in one-to-one correspondence with the three anodes 5B, respectively. The three anodes 5B are electrically connected to three anode pads 5P1, respectively, and the one common cathode 5C is electrically connected to a cathode pad 5P2. For example, the three light emitting regions 5A may be configured to emit red light, green light, and blue light, respectively. For ease of description, the light emitting region emitting red light is referred to as a first light emitting region 5A1, the light emitting region emitting green light is referred to as a second light emitting region 5A2, and the light emitting region emitting blue light is referred to as a third light emitting region 5A3.

For example, an area of an orthographic projection of the first light emitting region 5A1 on the substrate 5S is larger than an area of an orthographic projection of the second light emitting region 5A2 on the substrate 5S, and the area of the orthographic projection of the second light emitting region 5A2 on the substrate 5S is larger than an area of an orthographic projection of the third light emitting region 5A2 on the substrate 5S.

Referring to FIG. 3, the orthographic projections of the first light emitting region 5A1, the second light emitting region 5A2, the third light emitting region 5A3 and the cathode pad 5P2 of the first light emitting diode chip 51 on the substrate 5S of the first light emitting diode chip 51 are arranged at intervals from each other. For example, they are located at four corners of the substrate 5S, respectively.

For example, the orthographic projections of the first light emitting region 5A1, the second light emitting region 5A2, and the third light emitting region 5A3 of the first light emitting diode chip 51 on the substrate 5S of the first light emitting diode chip 51 may cover orthographic projections of the corresponding anode pads 5P1 on the substrate 5S of the first light emitting diode chip 51, respectively.

Referring to FIGS. 2, 4 and 6, the second light emitting diode chip 52 or the fourth light emitting diode chip 53 may include six light emitting regions 5A. Correspondingly, the second light emitting diode chip 52 or the fourth light emitting diode chip 53 may include six anodes 5B and one common cathode 5C. The six light emitting regions 5A are in one-to-one correspondence with the six anodes 5B, respectively. The six anodes 5B are electrically connected to six anode pads 5P1, respectively, and the one common cathode 5C is electrically connected to a cathode pad 5P2. For example, among the six light emitting regions, three light emitting regions 5A are divided as a group, and may be configured to emit red light, green light, and blue light, respectively. For ease of description, the light emitting region emitting red light is referred to as a first light emitting region 5A1, the light emitting region emitting green light is referred to as a second light emitting region 5A2, and the light emitting region emitting blue light is referred to as a third light emitting region 5A3.

For example, some of the plurality of light emitting regions 5A of the second light emitting diode chip 52 or the fourth light emitting diode chip 53 are located in the second pixel unit, and some others of the plurality of light emitting regions 5A are located in the third pixel unit, the number of the light emitting regions 5A of the second light emitting diode chip 52 or the fourth light emitting diode chip 53 is greater than the number of the light emitting regions of the first light emitting diode chip 51.

For example, an area of an orthographic projection of the first light emitting region 5A1 on the substrate 5S is larger than an area of an orthographic projection of the second light emitting region 5A2 on the substrate 5S, and the area of the orthographic projection of the second light emitting region 5A2 on the substrate 5S is larger than an area of an orthographic projection of the third light emitting region 5A3 on the substrate 5S.

Referring to FIG. 2, a group of light emitting regions 5A1, 5A2, 5A3 are located in a pixel unit sharing the second light emitting diode chip 52 or the fourth light emitting diode chip 53, and the other group of light emitting regions 5A1, 5A2, 5A3 are located in the other pixel unit sharing the second light emitting diode chip 52 or the fourth light emitting diode chip 53.

Orthographic projections of the six light emitting regions and the cathode pad 5P2 of the second light emitting diode chip 52 on the substrate 5S of the second light emitting diode chip 52 are arranged at intervals from each other. For example, the orthographic projections of the two first light emitting regions 5A1 of the second light emitting diode chip 52 on the substrate 5S are located at two opposite corners of the substrate 5S, respectively. The orthographic projections of the two second light emitting regions 5A2 of the second light emitting diode chip 52 on the substrate 5S are located at two opposite corners of the substrate 5S, respectively. The orthographic projections of the two third light emitting regions 5A3 of the second light emitting diode chip 52 on the substrate 5S are located at two opposite sides of the substrate 5S, respectively. For example, the orthographic projection of one third light emitting region 5A3 of the second light emitting diode chip 52 on the substrate 5S is located in a middle position of the orthographic projection of one first light emitting region 5A1 on the substrate 5S and the orthographic projection of one second light emitting region 5A2 on the substrate 5S.

For example, the orthographic projection of the cathode pad 5P2 of the second light emitting diode chip 52 on the substrate 5S may be located approximately at a geometric center of the substrate 5S. For example, the orthographic projection of the cathode pad 5P2 of the second light emitting diode chip 52 on the substrate 5S is approximately located at a position where two diagonal lines of the substrate 5S intersect. Alternatively, the orthographic projection of the cathode pad 5P2 of the second light emitting diode chip 52 on the substrate 5S is located at a junction of the first pixel unit and the second pixel unit.

For example, the orthographic projections of the first light emitting region 5A1, the second light emitting region 5A2, and the third light emitting region 5A3 of the second light emitting diode chip 52 on the substrate 5S of the second light emitting diode chip 52 may cover orthographic projections of the corresponding anode pads 5P1 on the substrate 5S of the second light emitting diode chip 52, respectively.

Referring to FIGS. 2, 5 and 6, the third light emitting diode chip 54 may include twelve light emitting regions 5A. Correspondingly, the third light emitting diode chip 54 may include twelve anodes 5B and one common cathode 5C. The twelve light emitting regions 5A are in one-to-one correspondence with the twelve anodes 5B. The twelve anodes 5B are electrically connected to twelve anode pads 5P1, respectively, and the one common cathode 5C is electrically connected to a cathode pad 5P2. For example, among the twelve light emitting regions, three light emitting regions 5A are divided as a group, and may be configured to emit red light, green light, and blue light, respectively. For ease of description, the light emitting region emitting red light is referred to as a first light emitting region 5A1, the light emitting region emitting green light is referred to as a second light emitting region 5A2, and the light emitting region emitting blue light is referred to as a third light emitting region 5A3.

For example, some of the plurality of light emitting regions 5A of the third light emitting diode chip 54 are located in the fourth pixel unit, and some others of the plurality of light emitting regions 5A are located in the fifth pixel unit, the sixth pixel unit and the seventh pixel unit. The number of the light emitting regions 5A of the third light emitting diode chip 54 is greater than the number of the light emitting regions 5A of the second light emitting diode chip 52.

For example, an area of an orthographic projection of the first light emitting region 5A1 on the substrate 5S is larger than an area of an orthographic projection of the second light emitting region 5A2 on the substrate 5S, and the area of the orthographic projection of the second light emitting region 5A2 on the substrate 5S is larger than an area of an orthographic projection of the third light emitting region 5A3 on the substrate 5S.

Referring to FIG. 2, each group of light emitting regions 5A1, 5A2, and 5A3 is located in one pixel unit among the four pixel units sharing the third light emitting diode chip 54.

The orthographic projections of the twelve light emitting regions of the third light emitting diode chip 54 and the cathode pad 5P2 on the substrate 5S of the third light emitting diode chip 54 are arranged at intervals from each other.

For example, an orthographic projection of the cathode pad 5P2 of the third light emitting diode chip 54 on the substrate 5S may be located approximately at a geometric center of the substrate 5S. For example, the orthographic projection of the cathode pad 5P2 of the third light emitting diode chip 54 on the substrate 5S is approximately located at a position where two diagonal lines of the substrate 5S intersect. Alternatively, the orthographic projection of the cathode pad 5P2 of the third LED chip 54 on the substrate 5S is located at a junction of the first pixel unit, the second pixel unit and the third pixel unit.

For example, the orthographic projections of the first light emitting region 5A1, the second light emitting region 5A2 and the third light emitting region 5A3 of the third light emitting diode chip 54 on the substrate 5S of the third light emitting diode chip 54 may cover the respective orthographic projections of the corresponding anode pads 5P1 on the substrate 5S of the third light emitting diode chip 54, respectively.

Continuing to refer to FIG. 2, the second light emitting diode chip 52 may include a plurality of light emitting regions 5A, a plurality of anodes 5B and a cathode 5C. The plurality of light emitting regions 5A and the plurality of anodes 5B are in one-to-one correspondence, and the plurality of light emitting regions 5A are arranged at intervals from each other. Some of the plurality of light emitting regions 5A are located in the second pixel unit PX2, and some others of the plurality of light emitting regions 5A are located in the third pixel unit PX4. For example, in the embodiment shown in FIG. 2, the second light emitting diode chip 52 may include six light emitting regions 5A, six anodes 5B and one cathode 5C, wherein three light emitting regions 5A are located in the second pixel unit PX2, and the other three light emitting regions 5A are located in the third pixel unit PX4.

Similarly, the fourth light emitting diode chip 53 includes a plurality of light emitting regions 5A, a plurality of anodes 5B and a cathode 5C. The plurality of light emitting regions 5A of the fourth light emitting diode chip 53 and the plurality of anodes 5B of the fourth light emitting diode chip 53 are in one-to-one correspondence, the light emitting regions 5A of the fourth light emitting diode chip 53 are arranged at intervals from each other. Some of the light emitting regions 5A of the fourth light emitting diode chip 53 are located in the eighth pixel unit PX3, some other parts of the plurality of light emitting regions 5A of the fourth light emitting diode chip 53 are located in the ninth pixel unit PXS. For example, in the embodiment shown in FIG. 2, the fourth light emitting diode chip 53 may include six light emitting regions 5A, six anodes 5B and one cathode 5C, wherein three light emitting regions 5A are located in the eighth pixel unit PX3, and the other three light emitting regions 5A are located in the ninth pixel unit PXS.

The third light emitting diode chip 54 may include a plurality of light emitting regions 5A, a plurality of anodes 5B and a cathode 5C, the plurality of light emitting regions 5A of the third light emitting diode chip 54 and the plurality of anodes 5B of the third light emitting diode chip 54 are in one-to-one correspondence, the light emitting regions 5A of the third light emitting diode chip 54 are arranged at intervals from each other. The first part of the plurality of light emitting regions 5A of the third light emitting diode chip 54 is located in the fourth pixel unit PX6, the second part of the plurality of light emitting regions 5A of the third light emitting diode chip 54 is located in the fifth pixel unit PX7, the third part of the plurality of light emitting regions 5A of the third light emitting diode chip 54 is located in the fifth pixel unit PX7, and the fourth part of the plurality of light emitting regions 5A of the third light emitting diode chip 54 is located in the seventh pixel unit PX9. For example, there are three light emitting regions 5A disposed in the fourth pixel unit PX6, the fifth pixel unit PX7, the sixth pixel unit PX8 and the seventh pixel unit PX9, respectively.

Referring to FIGS. 2 to 6, in the embodiment of the present disclosure, the display substrate realizes color display by using the light emitting diode chip 5 and a light conversion portion 600. For example, the light conversion portion may include a light conversion material such as quantum dots, for converting a light of a first wavelength into a light of a second wavelength. Exemplarily, the light emitting diode chip is an LED chip that emits blue light, and the light conversion portion includes a first light conversion portion for converting blue light into red light; and a second light conversion portion for converting blue light into a filtered light.

As shown in FIG. 6, a part of structures of the light emitting diode chip and the light conversion portion is schematically shown. In the embodiment shown in FIG. 6, the light conversion portion 600 is disposed on a side of the substrate 5S away from the light emitting region 5A, that is, the light conversion portion 600 and the light emitting region 5A are arranged on two sides of the substrate 5S, respectively. The plurality of light conversion portions 600 are in one-to-one correspondence with the plurality of light emitting regions 5A, respectively. For example, orthographic projections of the plurality of light conversion portions 600 on the base substrate 1 at least partially overlap with the orthographic projections of the plurality of light emitting regions 5A on the base substrate 1, respectively.

In order to avoid cross-color from generating between adjacent sub-pixels, a light shielding portion 400 is disposed between adjacent light conversion portions 600. As shown in FIG. 6, according to an optical path of a light emitted from the light emitting region 5A, a width of the light shielding portion 400, that is, a separation distance between adjacent light converting portions 600 may be calculated. For example, the inventor found through researches that the separation distance between adjacent light conversion portions 600 is more than 8 microns. Specifically, in the embodiment of the present disclosure, a distance between the plurality of light emitting regions of the second light emitting diode chip 52 is more than 8 microns, a distance between the plurality of light emitting regions of the fourth light emitting diode chip 53 is more than 8 microns, and a distance between the plurality of light emitting regions of the third light emitting diode chip 54 is more than 8 microns. In this way, the area of the light emitting diode chip may be reduced, while an occurrence of cross-color between adjacent sub-pixels may be avoided.

Figure 7:
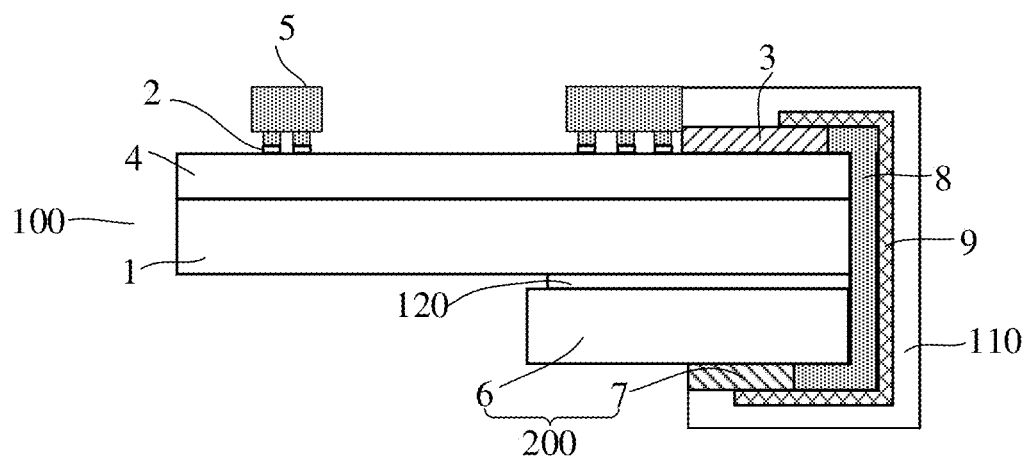
FIG. 7 is a cross-sectional view of a display substrate taken along line BB' in FIG. 2 according to some exemplary embodiments of the present disclosure.

FIG. 7 is a cross-sectional view of a display substrate taken along line BB' in FIG. 2 according to some exemplary embodiments of the present disclosure. In a process of manufacturing a display substrate according to the embodiments of the present disclosure, it is generally necessary to fold or turn over a substrate carrying a circuit board or an integrated circuit (hereinafter referred to as a second base substrate) to a back of the base substrate, and electrically connecting a terminal (PAD) of the light emitting diode chip on the front surface of the base substrate with the circuit on the back surface of the base substrate by using bonding wires. FIGS. 8A to 8G are cross-sectional views schematically show structures formed after some steps of a method of manufacturing a display substrate are performed. Referring to FIG. 7 and FIGS. 8A to 8G, the method of manufacturing a display substrate may be performed according to the following steps.

In step S101, a first substrate 100 is provided.

Figure 8A:
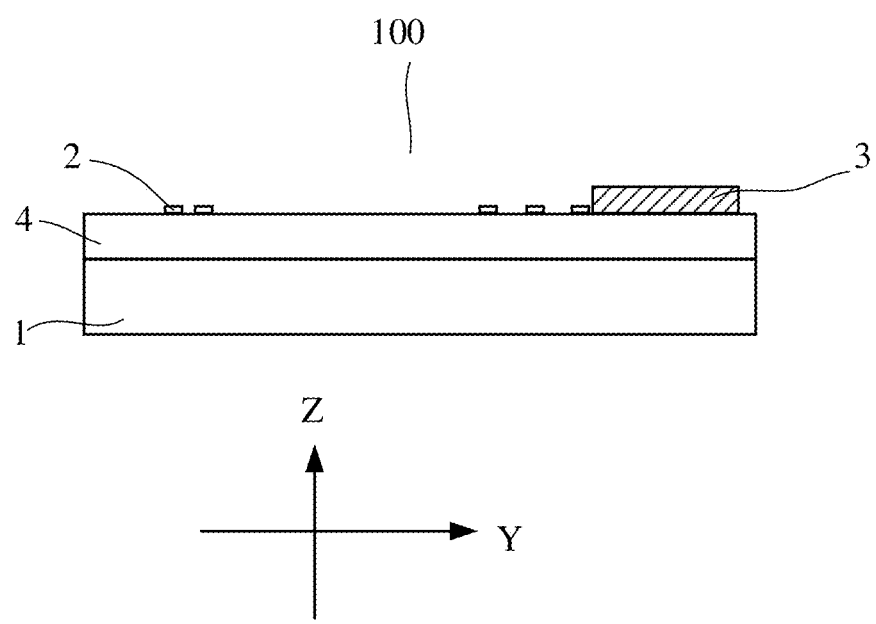
FIGS. 8A to 8G are cross-sectional views schematically show structures formed after some steps of a method of manufacturing a display substrate are performed.

Referring to FIGS. 2 and 8A, the first substrate 100 may include a base substrate 1 and a plurality of first electrodes 2 and a plurality of first terminals 3 disposed on the base substrate 1. The plurality of first terminals 3 are located at the edge of the first substrate 100. For example, the plurality of first terminals 3 are located in a fan-out region of the first substrate 100 for electrically connecting a signal line on the first substrate 100 (eg, the signal line is connected to terminals of each light emitting diode) to an external driving circuit.

For example, a material of the base substrate 1 may include, but is not limited to, glass, quartz, plastic, silicon, polyimide, and the like. The first electrode 2 and the first terminal 3 may have columnar structures. A material of the first electrode 2 and a material of the first terminal 3 may include a conductive material, such as a metal material, etc. Specifically, the material may be at least one or a combination of at least two selected from gold, silver, copper, aluminum, molybdenum, gold alloy, silver alloy, copper alloy, aluminum alloy, molybdenum alloy, which is not limited by the embodiments of the present disclosure.

For example, the first substrate 100 may further include a driving circuit 4 electrically connected to the plurality of first electrodes 2, and the driving circuit 4 is disposed on the base substrate 1. The driving circuit 4 may be used to provide electrical signals to a light emitting diode chip subsequently formed on the plurality of first electrodes 2 to control a light emitting brightness of the light emitting diode chip. For example, in some examples, the driving circuit 4 may be a plurality of pixel driving circuits connected with each light emitting diode chip in a one-to-one correspondence, or a plurality of micro integrated circuit chips connected with each light emitting diode chip in a one-to-one correspondence, and other structures, so as to control each light emitting diode chip to emit different brightness gray scales. It should be noted that, a specific circuit structure of the driving circuit 4 on the first substrate 100 may be set according to actual needs, which is not limited in the embodiments of the present disclosure. Hereinafter, the driving circuit 4 will be exemplarily described with reference to the accompanying drawings.

In step S102, a plurality of light emitting diode chips 5 are transferred and bonded onto the first substrate 100.

Figure 8B:
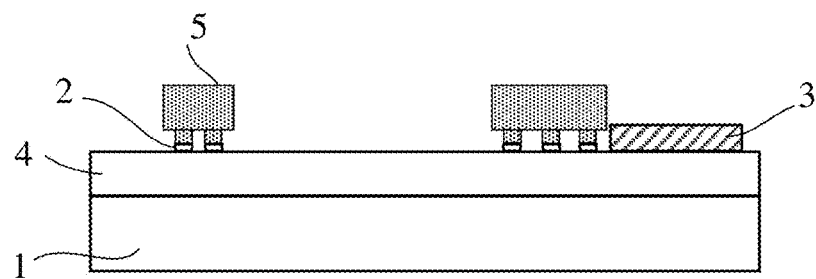

Referring to FIGS. 2 and 8B, each of the plurality of light emitting diode chips 5 includes an N electrode and a P electrode, the N electrode and the P electrode of the light emitting diode chip 5 are connected to the corresponding first electrodes 2, respectively, and surfaces of the plurality of first terminals 3 are exposed.

Referring to FIG. 2, the plurality of light emitting diode chips are arranged in an array in the first direction X and the second direction Y. For example, the first direction X is the row direction and the second direction Y is the column direction. Certainly, the embodiments of the present disclosure are not limited thereto, and the first direction and the second direction may be any direction, as long as the first direction intersects with the second direction. In addition, the plurality of light emitting diode chips are not limited to being arranged in a straight line, but may also be arranged in a curved line, a circular arrangement or an arbitrary manner, which may be determined according to actual needs, and is not limited by the embodiments of the present disclosure.

For example, the light emitting diode chip may include a micro light emitting diode (Micro LED) or a mini light emitting diode (Mini LED).

In step S103, a second substrate 200 is provided, and the first substrate 100 and the second substrate 200 are placed on a carrier 300.

For example, the second substrate 200 may be a circuit board, such as a Printed Circuit Board (PCB), a Flexible Printed Circuit (FPC), or a Chip On Film (COF), or the like.

Figure 8C:
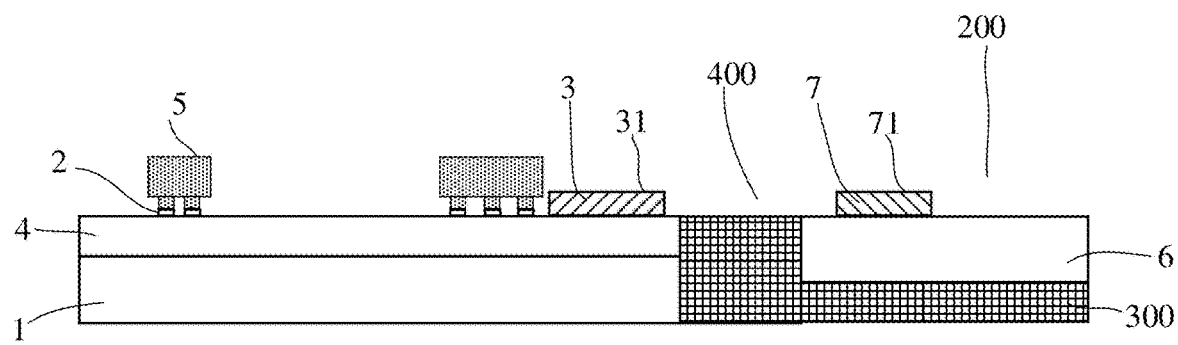

Referring to FIG. 8C, the second substrate 200 may include a second base substrate 6 and a plurality of second terminals 7 disposed on the second base substrate 6. For example, the plurality of second terminals 7 may be arranged in the first direction X (a direction perpendicular to the paper surface in FIG. 8C). That is, the plurality of second terminals 7 constitute a second row of terminals. For example, the plurality of second terminals 7 may be in one-to-one correspondence with the plurality of first terminals 3. That is, an arrangement period of the second terminals 7 is the same as an arrangement period of the first terminals 3.

Certainly, the second substrate 200 may also include an external driving circuit, such as an integrated circuit chip, disposed on the second substrate 6, but the embodiments of the present disclosure are not limited thereto.

The carrier 300 is used for spacing and fixing the first substrate 100 and the second substrate 200 to maintain a relative positional relationship between the first substrate and the second substrate. Referring to FIG. 8C, the first terminal 3 disposed on the first substrate 100 has a first surface 31 (shown as an upper surface in the drawing) away from the base substrate 1, and the second terminal 7 disposed on the second substrate 200 has a second surface 71 (shown as the upper surface in the drawing) away from the second base substrates 6.

Figure 8D:
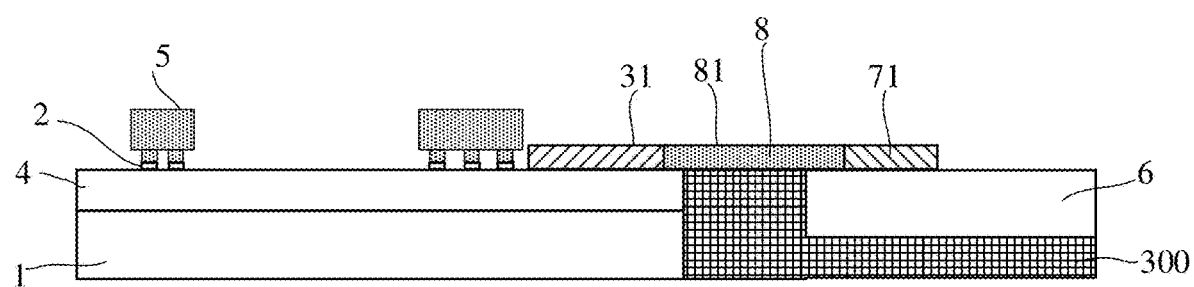

In step S104, referring to FIGS. 8C and 8D, a first protective adhesive layer 8 is formed in a gap 400 between a first row of terminals where the first terminal 3 is located and the second row of terminals where the second terminal 7 is located.

For example, a certain thickness of protective glue may be coated in the gap 400, and the protective glue at least fulfills the gap 400. In addition, due to a limitation of a coating accuracy, the protective glue may also cover at least a part of the surface of the first terminal 3 and the surface of the second terminal 7 located on two sides of the gap 400, the part of the protective glue covering the first terminal 3 and the second terminal 7 may be removed by laser ablation or film removal, so as not to affect subsequent processes, thereby obtaining a first protective adhesive layer 8 only filled in the gap 400. It should be understood that an orthographic projection of the first protective adhesive layer 8 on the carrier 300 covers an orthographic projection of the gap 400 on the carrier 300.

Referring to FIG. 8D, a sidewall of the first protective adhesive layer 8 close to the first substrate 100 contacts the first terminal 3, and a sidewall of the first protective adhesive layer 8 close to the second substrate 200 contacts the second terminal 7.

For example, the first protective adhesive layer 8 has a third surface 81 away from the carrier 300. The third surface 81, the first surface 31 and the second surface 71 are substantially at a same level, so as to ensure subsequent bonding wires to be formed on a relatively flat surface.

For example, a thickness of the first protective adhesive layer 8 is in a range of 5-500 microns, and a specific value is the same as a thickness of the first terminal 3 and/or the second terminal 7, and a Young's The modulus of a material of the first protective adhesive layer 8 may be between 0.1 Mpa~80 Gpa. For example, the material may be silica gel or polydimethylsiloxane (ie, PDMS).

In step S105, a bonding wire 9 is formed to electrically connect the first terminal 3 with the second terminal 7.

Figure 8E:
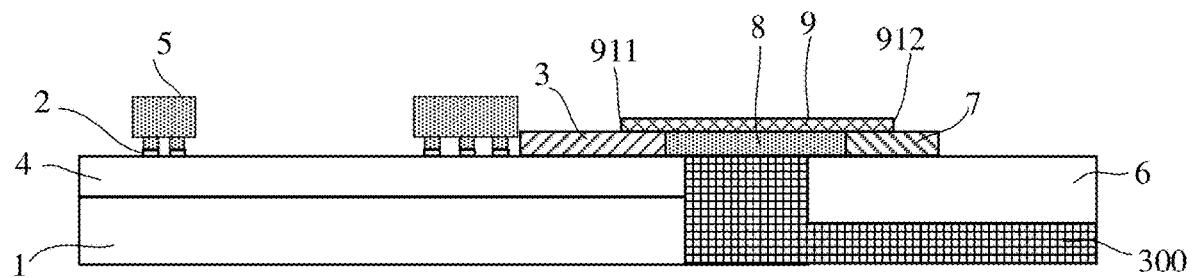

Referring to FIG. 8E, the bonding wire 9 is formed such that one end 91 of the bonding wire 9 is connected to the first terminal 3 and the other end 92 is connected to the second terminal 7. That is, one end 91 of the bonding wire 9 is welded to the first terminal 3, and the other end 92 is welded to the second terminal 7. Referring to FIG. 7, a welding point where the end 91 is welded on the first terminal 3 is referred to as a first welding point 911, and a welding point where the end 92 is welded on the second terminal 7 is referred to as a second welding point 921.

In the embodiment shown in FIG. 8E, the bonding wire 9 substantially extends in a plane where the first terminal 3 and the second terminal 7 are located, which is convenient for a subsequent bending process.

For example, the first welding point 911 may be a wedge-shaped welding point, that is, a shape of an orthographic projection of the first welding point 911 on the base substrate 1 has a wedge shape. In this case, a height of the first welding point 911 on the first terminal 3 may be controlled to be between 1 and 10 microns. A diameter of the bonding wire 9 may be between 10 and 500 microns. The height of the first welding point 911 on the first terminal 3 is smaller than the diameter of the bonding wire 9, so that the bonding wire 9 may substantially extend in the plane where the first terminal 3 and the second terminal 7 are located.

For example, the bonding wire 9 may be made of a metal such as Cu, Al, Au, Ag, or an alloy thereof.

Referring to FIG. 8E, each bonding wire 9 is electrically connected to a first terminal 3 and a corresponding second terminal 7, respectively. Since the plurality of first terminals 3 are arranged at equal intervals in the first direction X, the plurality of bonding wires 9 are also arranged at equal intervals in the first direction X.

In step S106, a second protective adhesive layer 110 is formed on the surface of each of the first terminal 3, the second terminal 7 and the bonding wire 9 away from the base substrate 1 and the second base substrate 6.

Figure 8F:
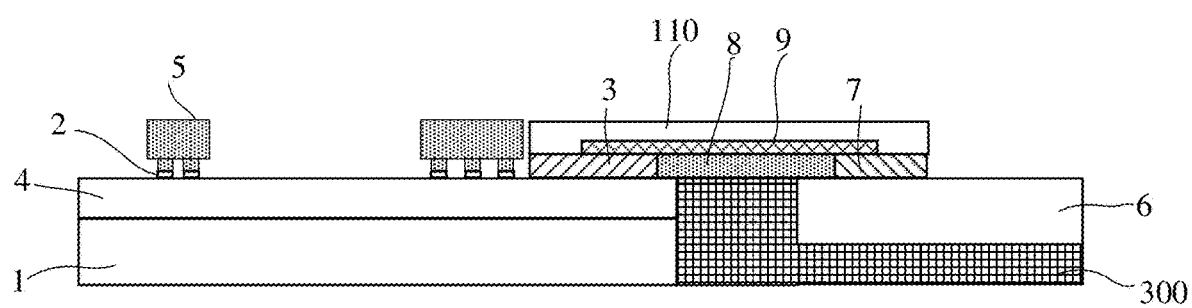

Referring to FIG. 8F, an orthographic projection of the second protective adhesive layer 110 in a direction perpendicular to the first surface 31 covers orthographic projections of each of the first terminal 3, the second terminal 7 and the bonding wire 9 in the direction perpendicular to the first surface 31. In this way, the bonding wire 9 and the welding point of the bonding wire 9 and each of the first terminal 3 and the second terminal 7 may be protected.

For example, a thickness of the second protective adhesive layer 110 is in a range of 5 to 500 microns, and a Young's modulus of a material of the second protective adhesive layer 110 may be between 0.1 Mpa and 80 Gpa. For example, the material may be silica gel Or polydimethylsiloxane (i.e. PDMS).

In some examples, the thickness of the second protective adhesive layer 110 may be substantially equal to the thickness of the first protective adhesive layer 8. In this way, the bonding wire 9 may be ensured to be located at a neutral layer of the upper and lower protective adhesive layers.

In step S107, a back adhesive 120 is attached to any one of a surface of the base substrate 1 away from the first terminal 3 and a surface of the second base substrate 6 away from the second terminal 7. For example, referring to FIG. 8G, the back adhesive 120 is attached on the surface of the base substrate 1 away from the first terminal 3.

Figure 8G:
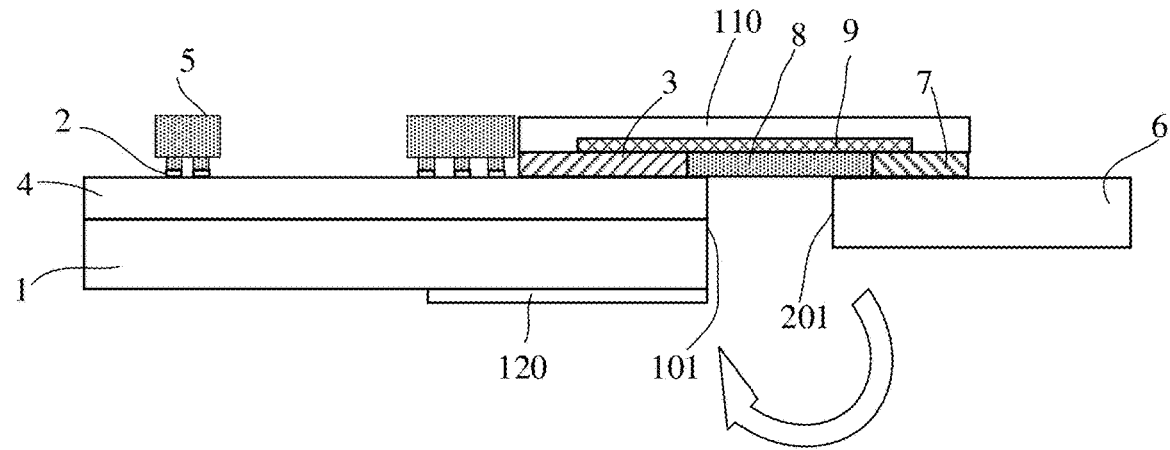

In step S108, referring to FIG. 8G and FIG. 7, the second substrate 200 is turned over toward the first substrate 100, so that the surface of the second base substrate 6 away from the second terminal 7 is attached to the back adhesive 120.

In this way, the second substrate 200 may be bent to the back of the first substrate 100, and the two substrates 100 and 200 may be attached together by the back adhesive 120.

For example, in a process of turning over the second substrate 200, the second substrate 200 may be rotated to a lower surface of the first substrate 100 by the carrier 300 having a fixed rotation track, so as to ensure a stability of the turning process and reduce a risk of breaking the bonding wire 9.

Referring to FIG. 7, in step S108, the second substrate 200 is turned over, so that the surface of the first protective adhesive layer 8 away from the bonding wire 9 contacts the first substrate 100, the back adhesive 120 and the second substrate 200. Specifically, a surface of the first protective adhesive layer 8 away from the bonding wire 9 contacts a sidewall of the first substrate 100, a sidewall of the back adhesive 120 and a sidewall of the second substrate 200. In this way, the sidewalls of the first substrate 100, the back adhesive 120 and the second substrate 200 completely support the first protective adhesive layer 8, thereby completely supporting the bonding wire 9 to improve the reliability. In the method of manufacturing the display substrate according to the embodiment of the present disclosure, the bonding wire is manufactured by using the wire bonding process, and the substrate is turned over to realize a laminated structure of the upper and lower substrates, which may reduce a process complexity and a manufacturing cost.

Referring to FIG. 1 to FIG. 7, a specified distance D needs to be reserved at the side edge of the display substrate, so as to provide the bonding wire 9 and the protective adhesive layer, etc. and leaving a sufficient bending radius for the bonding wire 9 to be bent to the back of the display substrate. Specifically, the specified distance D may include a first distance D1, a second distance D2 and a third distance D3. For example, the first distance D1 may correspond to a length of the bonding wire 9 at the side edge, the second distance D2 may correspond to a minimum bending distance for the bonding wire 9 to be bent to the back, and the third distance D3 may correspond to the thickness of the protective adhesive layer. The inventor found through researches that the specified distance D is more than 150 microns under current process conditions.

Figure 9:
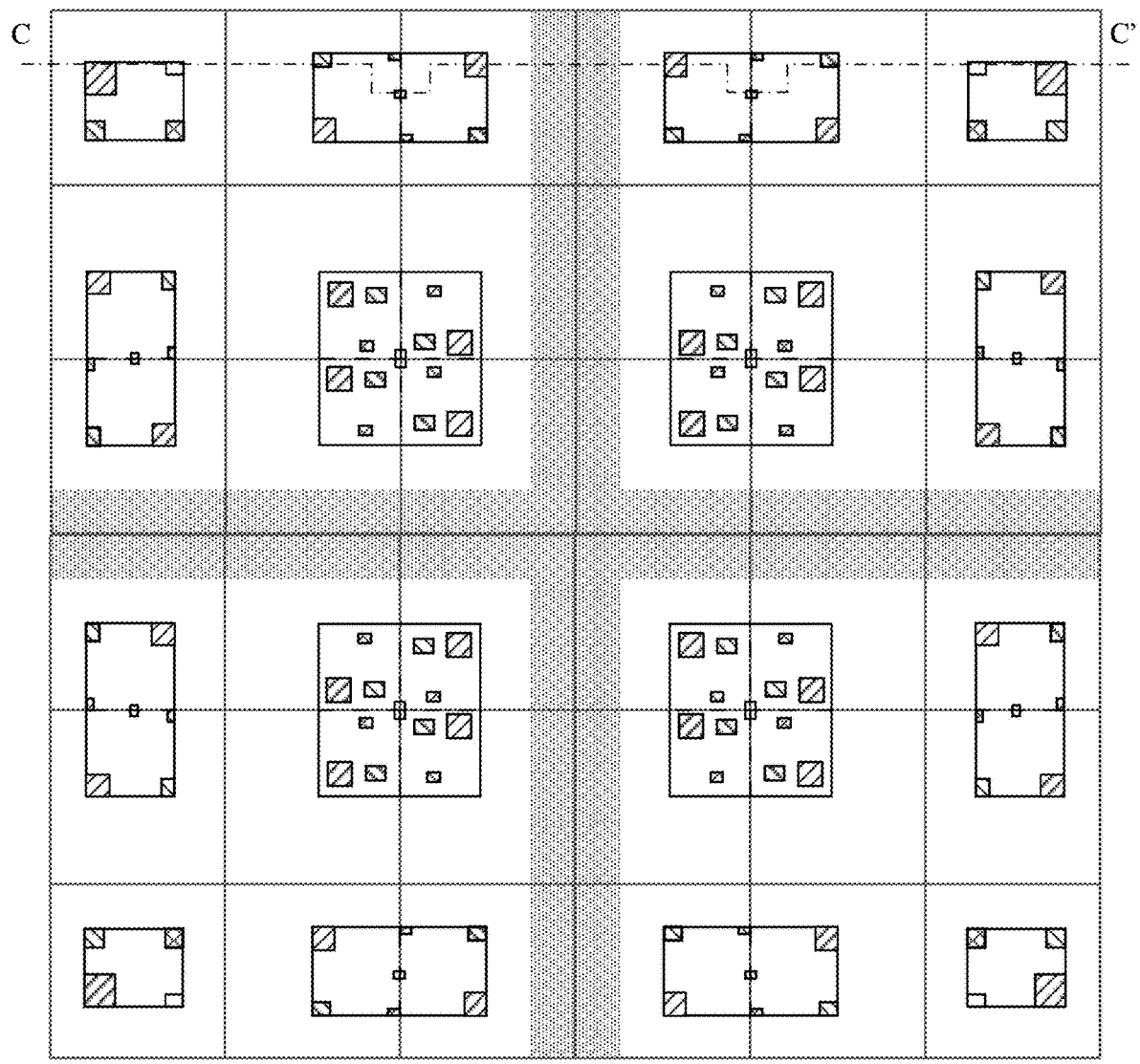
FIG. 9 is a partial plan view of a display panel according to some exemplary embodiments of the present disclosure.
Figure 10:
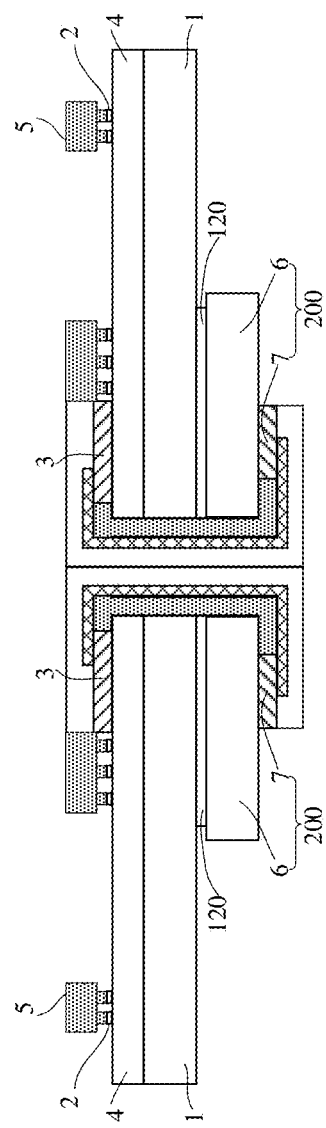
FIG. 10 is a cross-sectional view of a display panel taken along line CC' in FIG. 5 according to some exemplary embodiments of the present disclosure.

FIG. 9 is a partial plan view of a display panel according to some exemplary embodiments of the present disclosure. FIG. 10 is a cross-sectional view of the display panel taken along line CC' in FIG. 9 according to some exemplary embodiments of the present disclosure. Referring to FIG. 9 and FIG. 10, the display panel may be a tiled display substrate. For example, the display panel may be formed by tiling two of the above-mentioned display substrates. In order to provide the bonding wire 9, the protective adhesive layer, etc., and leave a sufficient bending radius for the bonding wire 9 to be bent to the back of the display substrate, a sufficient tiling distance needs to be reserved at a tiling position. For example, the tiling distance may be more than twice the specified distance D described above. In the embodiment of the present disclosure, a sufficient distance may be reserved at the side edges of the display substrate, which is beneficial to form the tiled display panel. Meanwhile, with the tiled display panel provided by the embodiments of the present disclosure, a light effect at the tiling position is less affected, which is beneficial to improve a display effect of the display panel.

Figure 11A:
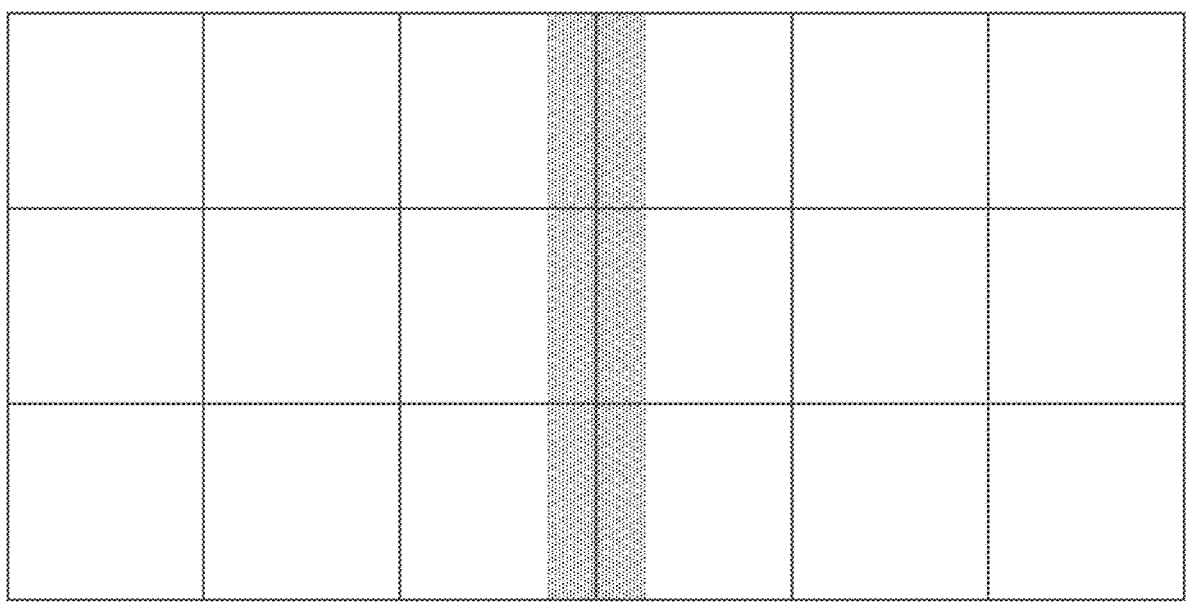
FIGS. 11A and 11B are partial plan views of a display panel according to some other exemplary embodiments of the present disclosure, respectively.
Figure 11B:
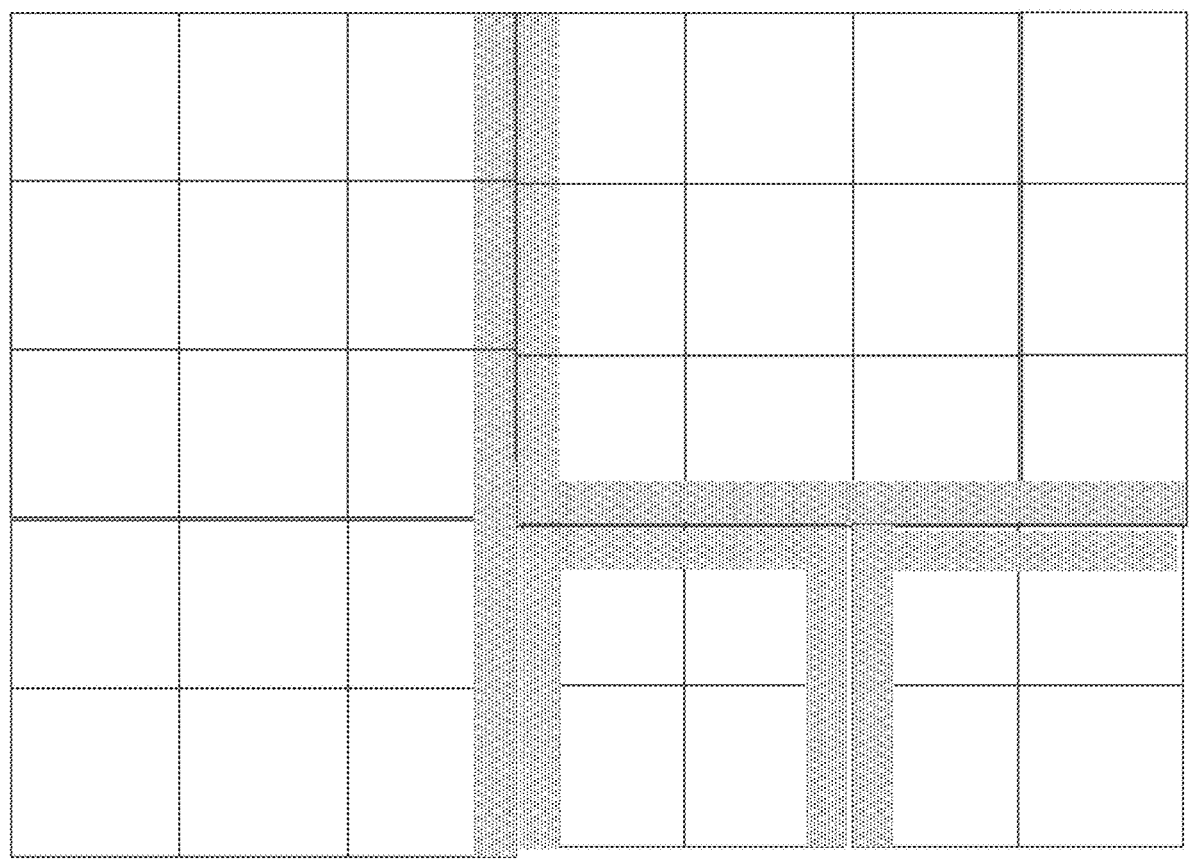

In the embodiment of FIG. 9, a situation in which four display substrates with the same structure and specification are tiled together to form a display panel is schematically shown. However, the embodiments of the present disclosure are not limited thereto. FIGS. 11A and 11B schematically show a schematic plan view of a display panel according to an embodiment of the present disclosure, respectively. As shown in FIG. 11A, two display substrates with the same structure and specifications are tiled together to form a display panel. That is, the two display substrates may be distributed axially symmetrically along a boundary line. As shown in FIG. 11B, four display substrates are tiled together to form a display panel, in which the side edges where the second LED chips or the fourth LED chips of two adjacent display substrates are located are close to each other.

In an embodiment of the present disclosure, a side edge of one display substrate may be tiled with a side edge of another display substrate in the first direction, and a side edge of one display substrate may be tiled with a side edge of another display substrate in the second direction.

Figure 13:
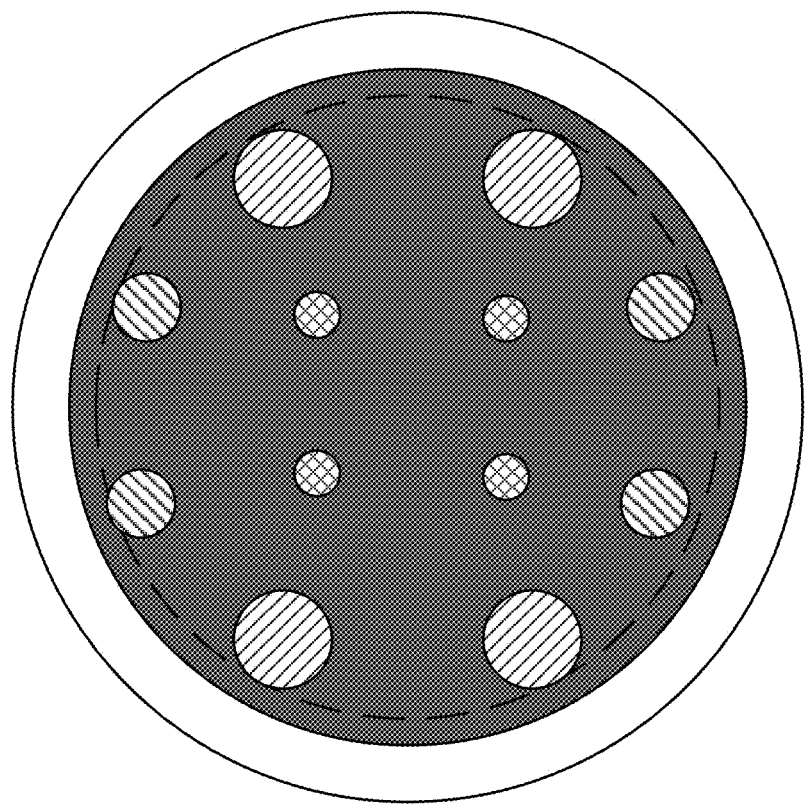
FIG. 13 schematically shows a schematic plan view of a third light emitting diode chip according to some exemplary embodiments of the present disclosure.

In the above embodiments, the shape of the orthographic projection of each light emitting diode chip on the base substrate 1 is rectangular, but the embodiments of the present disclosure are not limited to this. The shape of the orthographic projection on the base substrate 1 may be a circle, an ellipse, or other shapes. For example, FIG. 13 schematically shows a schematic plan view of a third light emitting diode chip according to some exemplary embodiments of the present disclosure. In the embodiment shown in FIG. 13, a shape of an orthographic projection of the third light emitting diode chip on the base substrate 1 is a circle.

For example, the driving circuit 4 may include a thin film transistor array layer. The thin film transistor array layer may specifically include an active layer, a gate insulating layer, a gate electrode, a source electrode, a drain electrode, a planarization layer, and the like. For a specific film layer structure of the driving circuit 4, reference may be made to the film layer structure applied in the existing array substrate, which will not be repeated here.

Some exemplary embodiments of the present disclosure also provide a display device. Referring to FIGS. 10, 11A and 11B, the display device includes at least two display substrates as described above. At least two of the above-mentioned display substrates are tiled together to form a display device. Since the light emitting diode chip in the pixel unit closest to the side edge of the display substrate is disposed away from the side edge, a sufficient tiling distance may be reserved at a tiling position. For example, the tiling distance may be two times the specified distance D. In this way, it is beneficial to form the tiled display device.

It should be noted that, some steps of the above-mentioned method may be performed individually or in combination, and may be performed in parallel or sequentially, and are not limited to the specific sequence of operations shown in the drawings.

It should be understood that the display device according to some exemplary embodiments of the present disclosure have all the features and advantages of the above-mentioned display substrates. For the features and advantages, reference may be made to the above description of the display substrates, and will not be repeated here.

As used herein, the terms "substantially," "approximately," "about," and other similar terms are used as terms of approximation rather than as terms of degree, and are intended to explain what would be recognized as an inherent deviation of a measured or calculated value by one of ordinary skill in the art. The "about" or "approximately" as used herein includes a stated value, and is intended to indicate a specific value determined by one of ordinary skill in the art is within an acceptable tolerance considering process fluctuation, measurement problems and errors related to the measurement of the specific amount (ie, a limitation of the measurement system). For example, "about" may mean within one or more standard deviations, or within ±10% or ±5% of the stated value.

Although some embodiments according to the general inventive concept of the present disclosure have been illustrated and described, those of ordinary skill in the art will appreciate that changes may be made to the embodiments without departing from the principle and the spirit of the general inventive concept of the present disclosure, and the scope of the present disclosure is defined by the claims and their equivalents.

What is claimed is:

1. A display substrate comprising:
   a base substrate comprising at least a side edge and a display area;
   a plurality of pixel units disposed in the display area comprising a first pixel unit, a second pixel unit and a third pixel unit, wherein the second pixel unit is located on a side of the first pixel unit close to the side edge, edges of the second pixel unit comprise the side edge, the third pixel unit is located between the first pixel unit and the second pixel unit, and the third pixel unit is adjacent to the second pixel unit; and
   a plurality of light emitting diode chips disposed on the base substrate comprising a first light emitting diode chip and a second light emitting diode chip, wherein the first light emitting diode chip is located in the first pixel unit, a part of the second light emitting diode chip is located in the second pixel unit, and the other part of the second light emitting diode chip is located in the third pixel unit.

2. The display substrate according to claim 1, wherein a shortest distance, between the second light emitting diode chip and a boundary of the second pixel unit where the part of the second light emitting diode chip is located close to the side edge, is greater than a shortest distance, between the first light emitting diode chip and a boundary of the first pixel unit where the part of the first light emitting diode chip is located.

3. The display substrate according to claim 1, wherein an area of an orthographic projection of the part of the second light emitting diode chip located in the second pixel unit on the base substrate is smaller than an area of an orthographic projection of the first light emitting diode chip on the base substrate.

4. The display substrate according to claim 3, wherein an area of an orthographic projection of the second light emitting diode chip on the base substrate is greater than the area of the first light emitting diode chip on the base substrate, and the area of the orthographic projection of the second light emitting diode chip on the base substrate is smaller than two times the area of the first light emitting diode chip on the base substrate.

5. The display substrate according to claim 1, wherein the plurality of pixel units further comprises a fourth pixel unit, a fifth pixel unit, a sixth pixel unit and a seventh pixel unit, edges of the fourth pixel unit comprise a first side edge and a second side edge intersecting with each other, and the fifth pixel unit, the sixth pixel unit and the seventh pixel unit are adjacent to the fourth pixel unit, respectively;
wherein the plurality of light emitting diode chips further comprises a third light emitting diode chip, a part of the third light emitting diode chip is located in the fourth pixel unit, and other parts of the third light emitting diode chip are located in the fifth pixel unit, the sixth pixel unit and the seventh pixel unit, respectively.

6. The display substrate according to claim 5, wherein a shortest distance, between the third light emitting diode chip and a boundary of the third pixel unit where the part of the third light emitting diode chip is located close to the side edge, is greater than a shortest distance, between the first light emitting diode chip and a boundary of the first pixel unit where the part of the first light emitting diode chip is located.

7. The display substrate according to claim 5, wherein an area of an orthographic projection of the part of the third light emitting diode chip located in the fourth pixel unit on the base substrate is smaller than an area of an orthographic projection of the first light emitting diode chip on the base substrate.

8. The display substrate according to claim 7, wherein an area of an orthographic projection of the third light emitting diode chip on the base substrate is greater than the area of the first light emitting diode chip on the base substrate, and the area of the orthographic projection of the third light emitting diode chip on the base substrate is smaller than four times the area of the first light emitting diode chip on the base substrate.

9. The display substrate according to claim 1, wherein the light emitting diode chip comprises a substrate, and a plurality of light emitting regions, a plurality of anodes and a cathode disposed on the substrate, the plurality of light emitting regions are in one-to-one correspondence with the plurality of anodes, and the plurality of light emitting regions are arranged at intervals from each other.

10. The display substrate according to claim 9, wherein the light emitting diode chip further comprises a cathode pad electrically connected to the cathode, and the cathode pad and the plurality of light emitting regions are arranged at intervals from each other.

11. The display substrate according to claim 10, wherein some of a plurality of light emitting regions of the second light emitting diode chip are located in the second pixel unit, some others of the plurality of light emitting regions are located in the third pixel unit, and the number of the light emitting regions of the second light emitting diode chip is greater than the number of the light emitting regions of the first light emitting diode chip.

12. The display substrate according to claim 11, wherein an orthographic projection of a cathode pad of the second light emitting diode chip is located at a junction of the second pixel unit and the third pixel unit.

13. The display substrate according to claim 12, wherein an orthographic projection of a cathode pad of a third light emitting diode chip is located at a junction of a fourth pixel unit, a fifth pixel unit, a sixth pixel unit and a seventh pixel unit.

14. The display substrate according to claim 10, wherein some of a plurality of light emitting regions of a third light emitting diode chip are located in a fourth pixel unit, some others of the plurality of light emitting regions are located in a fifth pixel unit, a sixth pixel unit and a seventh pixel unit, respectively, and the number of the light emitting regions of the third light emitting diode chip is greater than the number of the light emitting regions of the second light emitting diode chip.

15. The display substrate according to claim 9, wherein the plurality of light emitting regions of the light emitting diode chip are spaced apart from each other by more than 8 microns.

16. The display substrate according to claim 9, wherein the display substrate further comprises a plurality of light conversion portions, and orthographic projections of the plurality of light conversion portions on the base substrate at least partially overlap with orthographic projections of the plurality of light emitting regions on the base substrate, respectively.

17. The display substrate according to claim 1, wherein the display substrate further comprises a wiring region located at the at least one side edge;
wherein the display substrate further comprises a plurality of wirings in the wiring region, and the plurality of wirings are configured to provided electrical signals to the plurality of light emitting diode chips, respectively.

18. A tiled display panel, comprising:
a plurality of first display substrates and a plurality of second display substrates, wherein the plurality of first display substrates and the plurality of second display substrates are the display substrate according to claim 1,
wherein a side edge of the first display substrate is tiled with a side edge of the second display substrate in a first direction, and/or the side edge of the first display substrate is tiled with the side edge of the second display substrate in a second direction, and the first direction intersects with the second direction.

19. The tiled display panel according to claim 18, wherein the first display substrate and the second display substrate are distributed axially symmetrically along a tiling position, and the tiling position comprises the side edge of the first display substrate close to the second display substrate and the side edge of the second display substrate close to the first display substrate.

20. A display device, comprising: the tiled display panel according to claim 18; and a driving circuit configured to drive the tiled display panel.

* * * * *